(12) United States Patent
Gopinath et al.

(10) Patent No.: US 12,136,468 B2
(45) Date of Patent: Nov. 5, 2024

(54) CALIBRATION METHODS AND STRUCTURES FOR PARTITIONED MEMORY ARCHITECTURE WITH SINGLE RESISTOR OR DUAL RESISTOR MEMORY ELEMENTS

(71) Applicant: GlobalFoundries U.S. Inc., Malta, NY (US)

(72) Inventors: Venkatesh P. Gopinath, Fremont, CA (US); Pirooz Parvarandeh, Los Altos Hills, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 233 days.

(21) Appl. No.: 18/045,529

(22) Filed: Oct. 11, 2022

(65) Prior Publication Data
US 2024/0119974 A1  Apr. 11, 2024

(51) Int. Cl.
| | | |
|---|---|---|
| G11C 7/10 | (2006.01) | |
| G11C 7/12 | (2006.01) | |
| G11C 13/00 | (2006.01) | |

(52) U.S. Cl.
CPC .......... G11C 7/1039 (2013.01); G11C 7/1012 (2013.01); G11C 7/12 (2013.01); G11C 13/0069 (2013.01)

(58) Field of Classification Search
CPC ....... G11C 7/1039; G11C 7/1012; G11C 7/12; G11C 13/0069
See application file for complete search history.

(56) References Cited

U.S. PATENT DOCUMENTS

| | | |
|---|---|---|
| 4,906,865 A | 3/1990 | Holler |
| 7,830,705 B2 | 11/2010 | Jeong |

(Continued)

FOREIGN PATENT DOCUMENTS

| | | |
|---|---|---|
| CN | 113139641 A | 7/2021 |
| DE | 102020126502 A1 | 5/2021 |

(Continued)

OTHER PUBLICATIONS

U.S. Appl. No. 18/045,479, Notice of Allowance dated Jun. 28, 2024, 28 pages.

(Continued)

*Primary Examiner* — Han Yang
(74) *Attorney, Agent, or Firm* — David Cain; Hoffman Warnick LLC

(57) ABSTRACT

Disclosed structures include a partitioned memory architecture, which includes single resistor or dual resistor memory elements, which is configured for in-memory pipeline processing with minimal local IR drops, and which further includes additional circuitry to facilitate calibration processing. In some embodiments, the additional circuitry enables calibration processing when in-memory pipeline processing is paused. In these embodiments, the same bitlines and data sensing elements used for in-memory pipeline processing are also used for calibration processing. In other embodiments, the additional circuitry enables calibration processing concurrent with in-memory pipeline processing. In these embodiments, the additional circuitry includes duplicate pairs of memory elements with programmable resistors that can be connected to the operational circuitry for in-memory pipeline processing, to the calibration circuitry (including calibration-specific sense lines and sensing elements) for calibration processing, or to neither such that one memory (Continued)

element of the duplicate pair always remains operational allowing the other to undergo calibration.

20 Claims, 16 Drawing Sheets

(56) References Cited

U.S. PATENT DOCUMENTS

| | | | |
|---|---|---|---|
| 9,450,021 | B1 | 9/2016 | Lee |
| 9,934,838 | B1 | 4/2018 | Han et al. |
| 10,290,679 | B1 | 5/2019 | Bhushan et al. |
| 11,335,401 | B1* | 5/2022 | Huang ............... G11C 29/021 |
| 11,393,512 | B2 | 7/2022 | Lai et al. |
| 2006/0126413 | A1 | 6/2006 | Liaw |
| 2014/0050020 | A1 | 2/2014 | Lee et al. |
| 2014/0169068 | A1 | 6/2014 | Lee et al. |
| 2016/0027488 | A1 | 1/2016 | Kim |
| 2016/0372187 | A1 | 12/2016 | Papandreou et al. |
| 2018/0260696 | A1 | 9/2018 | Suda et al. |
| 2018/0268898 | A1 | 9/2018 | Suzuki et al. |
| 2019/0147330 | A1* | 5/2019 | Otsuka ............... G11C 13/0069 706/29 |
| 2019/0236445 | A1 | 8/2019 | Das et al. |
| 2019/0392896 | A1 | 12/2019 | Chung |
| 2020/0356848 | A1 | 11/2020 | Lesso et al. |
| 2021/0064379 | A1 | 3/2021 | Mattina et al. |
| 2021/0263683 | A1 | 8/2021 | Bayat et al. |
| 2023/0066707 | A1 | 3/2023 | Chuang |
| 2023/0326524 | A1 | 10/2023 | Pasotti et al. |
| 2023/0326525 | A1 | 10/2023 | Akarvardar et al. |
| 2024/0038300 | A1 | 2/2024 | Kumar et al. |

FOREIGN PATENT DOCUMENTS

| | | |
|---|---|---|
| WO | 2018069716 A1 | 4/2018 |
| WO | 2020243300 A1 | 12/2020 |

OTHER PUBLICATIONS

U.S. Appl. No. 18/045,524, Office Action dated Jun. 11, 2024, 17 pages.
U.S. Appl. No. 18/045,545, Office Action dated Jun. 21, 2024, 23 pages.
U.S. Appl. No. 18/045,524, Response to Office Action filed Jun. 24, 2024, 11 pages.
Correll et al., "A Fully Integrated Reprogrammable CMOS-RRAM Compute-in-Memory Coprocessor for Neuromorphic Applications," IEEE Journal on Exploratory Solid-State Computational Devices and Circuits, published May 4, 2020, pp. 36-44.
European Search Report for EP Application No. 23187989.1-1211 dated Mar. 5, 2024, 9 pages, (corresponding to U.S. Appl. No. 18/045,545).
Chang et al., "AI hardware acceleration with analog memory: Microarchitectures for low energy at high speed, " IBM J. Res. & Dev. vol. 63, No. 6, Paper 8, Nov./Dec. 2019, 14 pages.
European Search Report for EP Application No. 23187147.6-1211 dated Mar. 6, 2024, 11 pages,(corresponding to U.S. Appl. No. 18/045,524).
European Search Report for EP Application No. 23187993.3-1211 dated Mar. 13, 2024, 9 pages, (corresponding to U.S. Appl. No. 18/045,479.
Aziza et al., "Multi-Level Control of Resistive RAM (RRAM) Using a Write Termination to Achieve 4 Bits/Cell in High Resistance State," Electronics 2021, 10, 2222, 15 pages.
Dong et al., "Design Considerations of Large-Scale RRAM-Based Convolutional Neural Networks with Transfer Learning," retrieved from https://www.researchgate.net/publication/343982199, uploaded Aug. 30, 2020, 7 pages.
Fick et al., "Analog In-Memory Subthreshold Deep Neural Network Accelerator," IEEE 2017, 4 pages.
Giannoula et al., "SparseP: Towards Efficient Sparse Matrix Vector Multiplication on Real Processing-In-Memory Systems," arXiv:2201.05072v4 [cs.AR], May 23, 2022, 60 pages.
Gu et al., "Technilogical Exploration of RRAM Crossbar Array for Matrix-Vector Multiplication," IEEE 2015, pp. 106-111.
Jaiswal et al., "8T SRAM Cell as a Multi-bit Dot Product Engine for Beyond von-Neumann Computing," IEEE Oct. 16, 2018, 10 pages.
Qiao et al., "AtomLayer: A universal ReRAM-based CNN accelerator with atomic layer computation," In Proceedings of the 55th Annual Design Automation Conference 6 pages.
Sahay et al., A 2T-1R Cell Array with High Dynamic Range for Mismatch-Robust and Efficient Neurocomputing, IEEE 2020, 4 pages.
Shafiee et al., "Isaac: A convolutional neural network accelerator with in-situ analog arithmetic in crossbars," ACM SIGARCH Computer Architecture News, 44(3), pp. 14-26.
Stathopoulos et al., "Multibit memory operation of metal oxide bi-layer memristors," Scientific Reports 7.1 (2017), 7 pages.
Xue et al., "Embedded 1-Mb ReRAM-Based Computing-in-Memory Macro With Multibit Input and weight for CNN- Baed AI Edge Processors," IEEE Journal of Solid-State Circuits, vol. 55, No. 1, Jan. 2020, pp. 203-215.
Yao et al., "Fully hardware-implemented memristor convolutional neural network," Nature, vol. 577, Jan. 30, 2020, pp. 641-662.
Yin et al., "Monolithically Integrated RRAM-and CMOS-Based In-Memory Computing Optimizations for Efficient Deep Learning," IEEE Mirco 2019, pp. 54-63.
EP Patent Application Serial No. 23187997.4-1211, Search Report dated Jul. 24, 2024, 9 pages.
U.S. Appl. No. 18/045,545, Response to Office Action filed Jul. 15, 2024, 17 pages.
U.S. Appl. No. 18/045,520, Office Action dated Jul. 22, 2024, 13 pages.

* cited by examiner

FIG. 8     TIMING DIAGRAM FOR PIPELINED PROCESSING WITH INTERSPERSED CALIBRATION

| | | Time | 1 | 2 | 3 | 4 | 4A | 4B | 4C | 4D | 5 | 6 | 7 | 8 | 9 | 10 | 11 | 12 | 13 |
|---|---|---|---|---|---|---|---|---|---|---|---|---|---|---|---|---|---|---|---|
| Sample 1 | Layer 1 | Sample all activations voltages | x | | | | | | | | | | | | | | | | |
| | Layer 1 | Allow settling time for the virtual ground buffer | | x | x | | | | | | | | | | | | | | |
| | Layer 1 | Activate the data processing element function | | | x | | | | | | | | | | | | | | |
| | Layer 1 | Provide the output to the next layer | | | | x | | | | | | | | | | | | | |
| | Layer 1 | Use MUX to switch input to Vcal | | | | | | | | | | | | | | | | | |
| | Layer 1 | Allow settling time for the virtual ground buffer | | | | | x | x | x | | | | | | | | | | |
| | Layer 1 | Activate the data processing element function | | | | | | | x | | | | | | | | | | |
| | Layer 1 | Measure and store the resistor value | | | | | | | | x | | | | | | | | | |
| Sample 1 | Layer 2 | Sample all activations voltages | | | | x | | | | | | | | | | | | | |
| | Layer 2 | Allow settling time for the virtual ground buffer | | | | | | | | | x | x | | | | | | | |
| | Layer 2 | Activate the data processing element function | | | | | | | | | | x | | | | | | | |
| | Layer 2 | Provide the output to the next layer | | | | | | | | | | | x | | | | | | |
| Sample 1 | Layer 3 | Sample all activations voltages | | | | | | | | | | | x | | | | | | |
| | Layer 3 | Allow settling time for the virtual ground buffer | | | | | | | | | | | | x | x | | | | |
| | Layer 3 | Activate the data processing element function | | | | | | | | | | | | | x | | | | |
| | Layer 3 | Provide the output to the next layer | | | | | | | | | | | | | | x | | | |
| Sample 2 | Layer 1 | Sample all activations voltages | | | | | | | | | x | | | | | | | | |
| | Layer 1 | Allow settling time for the virtual ground buffer | | | | | | | | | | x | x | | | | | | |
| | Layer 1 | Activate the data processing element function | | | | | | | | | | | x | | | | | | |
| | Layer 1 | Provide the output to the next layer | | | | | | | | | | | | x | | | | | |
| Sample 2 | Layer 2 | Sample all activations voltages | | | | | | | | | | | x | | | | | | |
| | Layer 2 | Allow settling time for the virtual ground buffer | | | | | | | | | | | | x | x | | | | |
| | Layer 2 | Activate the data processing element function | | | | | | | | | | | | | x | | | | |
| | Layer 2 | Provide the output to the next layer | | | | | | | | | | | | | | x | | | |
| Sample 2 | Layer 3 | Sample all activations voltages | | | | | | | | | | | | | | x | | | |
| | Layer 3 | Allow settling time for the virtual ground buffer | | | | | | | | | | | | | | | x | x | |
| | Layer 3 | Activate the data processing element function | | | | | | | | | | | | | | | | x | |
| | Layer 3 | Provide the output to the next layer | | | | | | | | | | | | | | | | | x |

FIG. 12 TIMING DIAGRAM FOR PIPELINE PROCESSING AND CONCURRENT CALIBRATION

| | Active | Cal | Time | | 1 | 2 | 3 | 4 | 5 | 6 | 7 | 8 | 9 | 10 | 11 | 12 | 13 |
|---|---|---|---|---|---|---|---|---|---|---|---|---|---|---|---|---|---|
| Sample 1 | Rx-U | Rx-D | Layer 1 | Sample all activations voltages | X | | | | | | | | | | | | |
| | Rx-U | Rx-D | Layer 1 | Allow settling time for the virtual ground buffer | | X | | | | | | | | | | | |
| | Rx-U | Rx-D | Layer 1 | Activate the data processing element function | | | X | | | | | | | | | | |
| | Rx-U | Rx-D | Layer 1 | Provide the output to the next layer | | | | X | | | | | | | | | |
| Sample 1 | Rx-U | Rx-D | Layer 2 | Sample all activations voltages | | | | X | | | | | | | | | |
| | Rx-U | Rx-D | Layer 2 | Allow settling time for the virtual ground buffer | | | | | X | | | | | | | | |
| | Rx-U | Rx-D | Layer 2 | Activate the data processing element function | | | | | | X | | | | | | | |
| | Rx-U | Rx-D | Layer 2 | Provide the output to the next layer | | | | | | | X | | | | | | |
| Sample 1 | Rx-U | Rx-D | Layer 3 | Sample all activations voltages | | | | | | | X | | | | | | |
| | Rx-U | Rx-D | Layer 3 | Allow settling time for the virtual ground buffer | | | | | | | | X | | | | | |
| | Rx-U | Rx-D | Layer 3 | Activate the data processing element function | | | | | | | | | X | | | | |
| | Rx-U | Rx-D | Layer 3 | Provide the output to the next layer | | | | | | | | | | X | | | |
| Sample 2 | Rx-D | Rx-U | Layer 1 | Sample all activations voltages | | | | X | | | | | | | | | |
| | Rx-D | Rx-U | Layer 1 | Allow settling time for the virtual ground buffer | | | | | X | | | | | | | | |
| | Rx-D | Rx-U | Layer 1 | Activate the data processing element function | | | | | | X | | | | | | | |
| | Rx-D | Rx-U | Layer 1 | Provide the output to the next layer | | | | | | | X | | | | | | |
| Sample 2 | Rx-D | Rx-U | Layer 2 | Sample all activations voltages | | | | | | | X | | | | | | |
| | Rx-D | Rx-U | Layer 2 | Allow settling time for the virtual ground buffer | | | | | | | | X | | | | | |
| | Rx-D | Rx-U | Layer 2 | Activate the data processing element function | | | | | | | | | X | | | | |
| | Rx-D | Rx-U | Layer 2 | Provide the output to the next layer | | | | | | | | | | X | | | |
| Sample 2 | Rx-D | Rx-U | Layer 3 | Sample all activations voltages | | | | | | | | | | X | | | |
| | Rx-D | Rx-U | Layer 3 | Allow settling time for the virtual ground buffer | | | | | | | | | | | X | | |
| | Rx-D | Rx-U | Layer 3 | Activate the data processing element function | | | | | | | | | | | | X | |
| | Rx-D | Rx-U | Layer 3 | Provide the output to the next layer | | | | | | | | | | | | | X |

CALIBRATION METHODS AND STRUCTURES FOR PARTITIONED MEMORY ARCHITECTURE WITH SINGLE RESISTOR OR DUAL RESISTOR MEMORY ELEMENTS

BACKGROUND

Field of the Invention

The present invention relates to in-memory processing and, more particularly, to a memory architecture for in-memory processing and calibration thereof.

Description of Related Art

Various processing applications (e.g., image processing applications, voice processing applications, or other machine learning (ML) or artificial intelligence (AI) processing) employ cognitive computing and, particularly, neural networks (NNs) (e.g., for recognition and classification). Those skilled in the art will recognize that a NN is a deep learning algorithm where approximately 90% of the computations performed in the algorithm are multiply-and-accumulate (MAC) operations. For example, in a NN for image processing, the various MAC operations are used to compute the products of inputs (also referred to as activations), which are identified intensity values of the pixels in a receptive field, and weights in a filter matrix (also referred to as a kernel) of the same size as the receptive field, and to further compute the sum of the products. These computations are referred to as dot product computations. Historically, software solutions were employed to compute NNs. Recently, processors with hardware-implemented NN's and, particularly, with memory-implemented NN's have been developed to increase processing speed. However, such memory implemented NNs typically require large memory cell arrays (i.e., arrays with a large number of rows and columns of memory cells) to implement and, as the complexity of such NNs increases, so does the size of the arrays. Unfortunately, such an increase in array size can result in an increase in local voltage ("IR") drops, thereby leading to processing errors.

SUMMARY

Disclosed herein are embodiments of a structure and, particularly, a partitioned memory architecture, which includes single resistor or dual resistor memory elements, which is configured for in-memory pipeline processing with minimal local IR drops, and which further includes additional circuitry to facilitate calibration processing.

Some embodiments of the disclosed structure are configured to enable in-memory pipeline processing and further to enable calibration processing when in-memory pipeline processing is paused. In these embodiments, the structure can include an array of memory banks arranged in rows and columns. Each memory bank can include input nodes, at least one bitline, and memory elements connected to the input nodes, respectively. Each memory element can include at least one programmable resistor connected between a corresponding input node and the at least one bitline. Each memory element can further include at least one feedback buffer circuit connected to the at least one bitline, respectively. In these embodiments of the structure, each row of the memory banks in the array can include an initial memory bank (i.e., the first memory bank in the row) and each initial memory bank can include: amplifiers connected in series between the input nodes and the memory elements, respectively; track-and-hold devices; a calibration supply line; and multiplexors. Each multiplexor can include at least a first input connected to one of the track-and-hold devices and a second input connected to the calibration supply line. Each multiplexor can further have an output connected to one of the amplifiers. Thus, each multiplexor can selectively connect either a track-and-hold device (which provides a voltage input signal for use during in-memory pipeline processing) or the calibration supply line (which provides a calibration input voltage for use during calibration processing) to the input of an amplifier.

Other embodiments of the structure disclosed herein are configured to enable in-memory pipeline processing and concurrent calibration processing.

For example, in one such embodiment, the structure can include an array of memory banks arranged in rows and columns. Each memory bank can include both operational circuitry and calibration circuitry. Each memory bank can further include duplicate pairs of single resistor memory elements. Each duplicate pair of single resistor memory elements can include two single resistor memory elements, where each single resistor memory element includes a single programmable resistor. Each duplicate pair of single resistor memory elements can also include switches at the opposing end terminals of the programmable resistors therein. These switches are controllable so that each programmable resistor of each single resistor memory element of each duplicate pair is connectable to (i.e., cable of being connected to) the operational circuitry, connectable to the calibration circuitry, and also disconnectable from (i.e., cable of being disconnected from) both the operational circuitry and the calibration circuitry. For example, the switches can be controlled so as to connect one programmable resistor of one single resistor memory element of a duplicate pair to the operational circuitry for in-memory pipeline processing and so as to either connect the programmable resistor of the other single resistor memory element of the duplicate pair to the calibration circuitry for calibration processing or disconnect it from both the operational circuitry and the calibration circuitry (e.g., when no calibration processing is being performed or when calibration processing is directed to a different programmable resistor in the same column).

In another embodiment, the structure can similarly include an array of memory banks arranged in rows and columns. Each memory bank can include both operational circuitry and calibration circuitry. Each memory bank can further include duplicate pairs of dual resistor memory elements. Each duplicate pair of dual resistor memory elements can include two dual resistor memory elements, where each dual resistor memory element in the pair include both a first programmable resistor and a second programmable resistor. Each duplicate pair of dual resistor memory elements further includes switches at opposing end terminals of both programmable resistors of each dual resistor memory element. These switches are controllable so that each programmable resistor of each dual resistor memory element of each duplicate pair is connectable to the operational circuitry, connectable to the calibration circuitry, and also disconnectable from both the operational circuitry and the calibration circuitry. For example, the switches can be controlled so as to connect the two programmable resistors of one dual resistor memory element of a duplicate pair to the operational circuitry for in-memory pipeline processing. In this case, the switches can further be controlled to connect one programmable resistor of the other dual resistor memory element of the duplicate pair to the calibration circuitry for calibration processing and to disconnect the other from the operational circuitry and the calibration circuit. Alternatively, the switches can further be controlled to disconnect both programmable resistors of the other dual resistor memory element of the duplicate pair from both the operational circuitry and the calibration circuitry (e.g., when no calibration processing is being performed or when calibration processing is directed to a different programmable resistor in the same column).

BRIEF DESCRIPTION OF THE SEVERAL VIEWS OF THE DRAWINGS

The present invention will be better understood from the following detailed description with reference to the drawings, which are not necessarily drawn to scale and in which:

FIG. 8 is an example of a timing diagram for in-memory pipeline processing with interspersed calibration using the disclosed structure of FIG. 1 or FIG. 2;

FIGS. 9B-1 to 9B-4 are schematic diagrams each illustrating the same duplicate pair of single resistor memory elements that could be incorporated into the structure of FIG. 9A with switches connected thereto in different states, respectively;

FIGS. 10B-1 to 10B-6 are schematic diagrams each illustrating the same duplicate pair of dual resistor memory elements that could be incorporated into the structure of FIG. 10A with switches connected thereto in different states, respectively;

FIG. 12 is an example of a timing diagram for in-memory pipeline processing with concurrent calibration using the disclosed structure of FIG. 9A or FIG. 10A.

DETAILED DESCRIPTION

Disclosed herein are embodiments of a structure and, particularly, a partitioned memory architecture, which includes single resistor or dual resistor memory elements, which is configured for in-memory pipeline processing (such as matrix vector multiplication processing, multiply-and-accumulate (MAC) processing, etc.) with minimal local IR drops, and which further includes additional circuitry to facilitate calibration processing. In some embodiments, the additional circuitry enables calibration processing when in-memory pipeline processing is paused (i.e., the additional circuitry enables interspersed calibration processing). In these embodiments, the same bitlines and data sensing elements used for in-memory pipeline processing are also used for calibration processing. In other embodiments, the additional circuitry enables calibration processing concurrent with in-memory pipeline processing. In these embodiments, the additional circuitry includes duplicate pairs of memory elements with programmable resistors that can be connected to the operational circuitry for in-memory processing, to the calibration circuitry (including calibration-specific sense lines and sensing elements) for calibration processing, or to neither such that one memory element of each duplicate pair always remains operational allowing the other to undergo calibration on demand.

Figure 1:
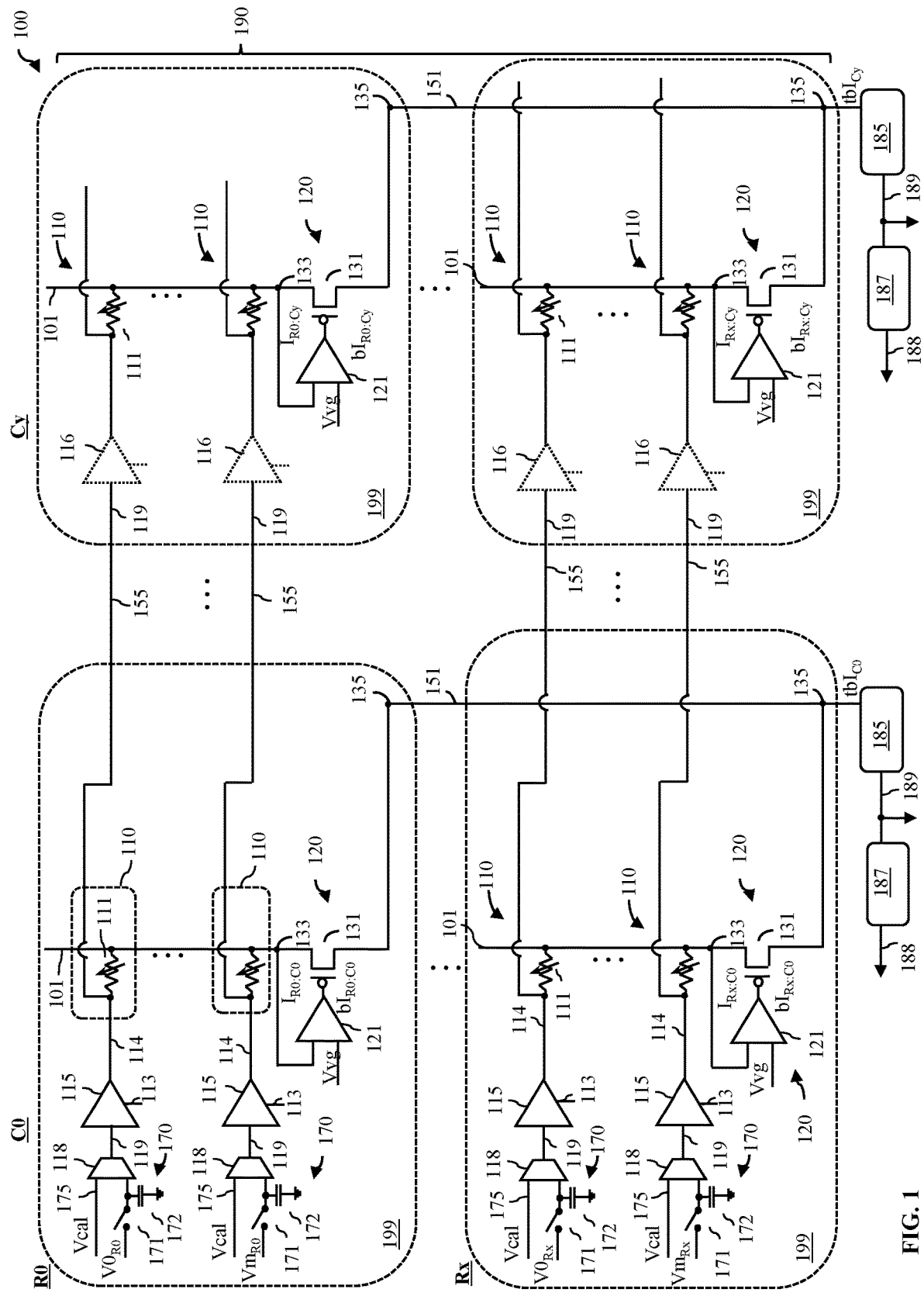
FIG. 1 is a schematic diagram illustrating a disclosed embodiment of a structure for in-memory pipeline processing and interspersed calibration processing.
Figure 2:
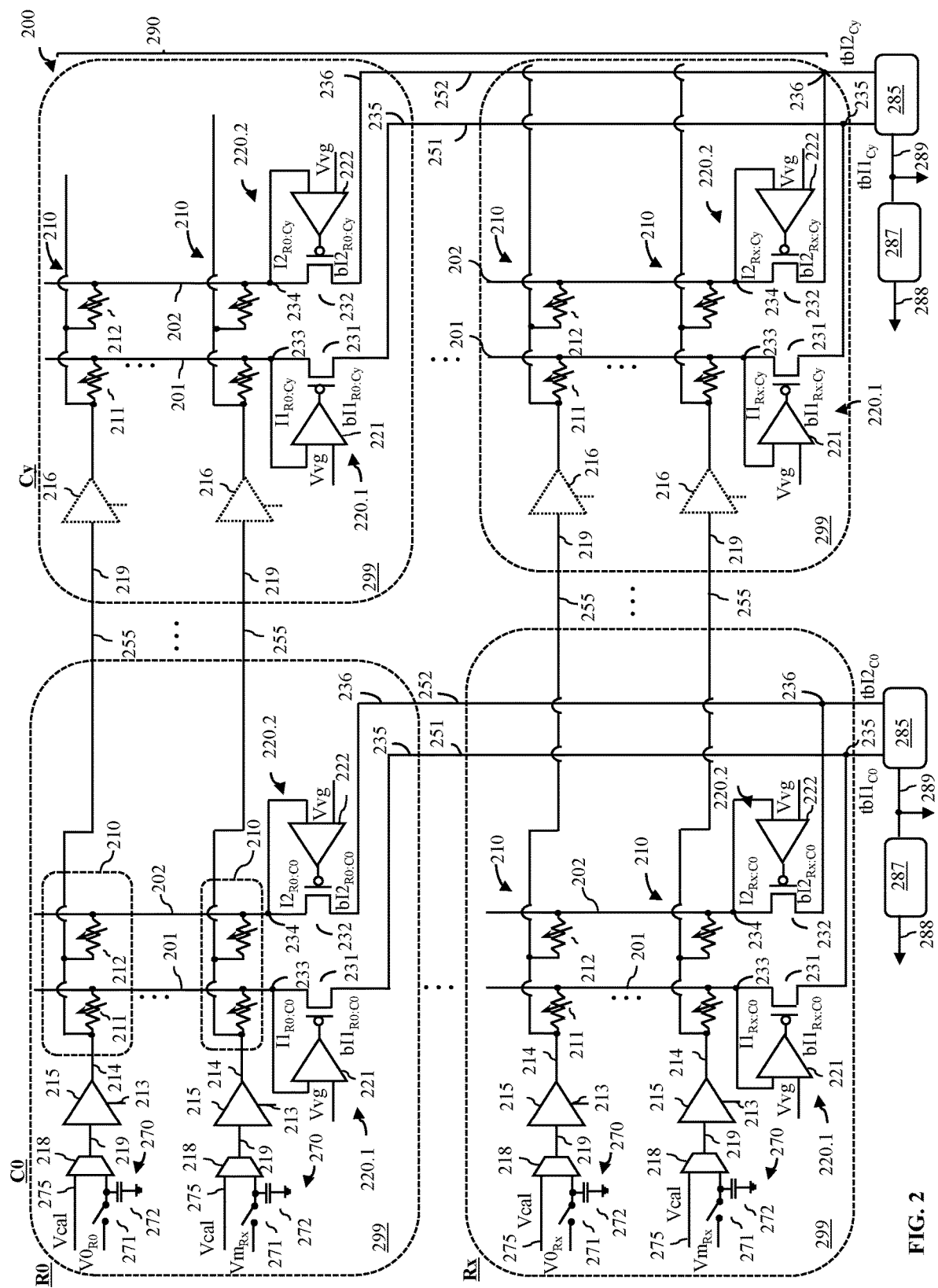
FIG. 2 is a schematic diagram illustrating another disclosed embodiment of a structure for in-memory pipeline processing and interspersed calibration processing.
Figure 3A:
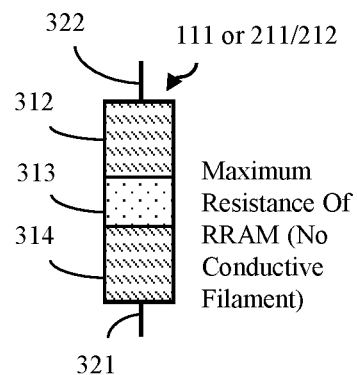
FIGS. 3A-3D are cross-section diagrams illustrating resistance states of a resistive random access memory (RRAM)-type programmable resistor that could be incorporated into the disclosed structure embodiments.
Figure 3B:
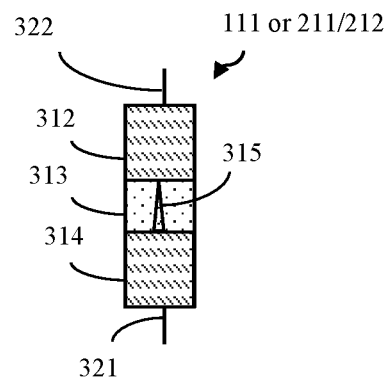
Figure 3C:
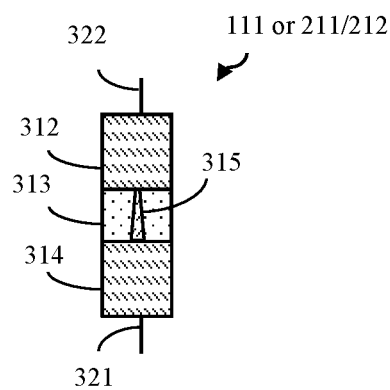
Figure 3D:
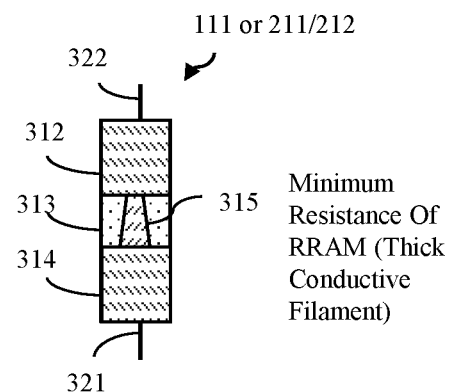

FIGS. 1 and 2 are schematic diagrams illustrating disclosed embodiments of a structure 100, 200, respectively, including a partitioned memory architecture configured to enable in-memory pipeline processing (e.g., MAC processing) to be paused for calibration processing.

As illustrated in FIGS. 1 and 2, the structure 100, 200 can include a partitioned array of memory elements 110, 210. In the structure 100, the memory elements 110 are single resistor memory elements, whereas, in the structure 200, the memory elements are dual resistor memory elements. Specifically, in the structure 100 each memory element 110 can include a single programmable resistor 111 (also referred to herein as a variable resistor). In the structure 200, each memory element 210 can include two programmable resistors and, particularly, a first programmable resistor 211 and a second programmable resistor 212. The first and second programmable resistors 211-212 can be essentially the same (i.e., can have the same design, be the same type, be made of the same materials, etc.). In any case, in the memory element 110 of the structure 100 or the memory element 210 of the structure 200, each programmable resistor can be any type of resistor having a controllable (i.e., adjustable) resistance and suitable for use as a non-volatile resistive memory element (i.e., a resistive memory element that retains its programmed resistance state even if/when the device loses power).

For example, each programmable resistor 111, 211-212 can be a resistive random access memory (RRAM)-type programmable resistor. Alternatively, each programmable resistor 111, 211-212 can be a phase change memory (PCM)-type programmable resistor, magnetic tunnel junction (MTJ)-type programmable resistor, or any other suitable type of programmable resistor configured so that, by applying specific bias conditions to one or both opposing end terminals of the resistor, the resistance of the programmable resistor can be changed between at least two different stable resistance states. For example, the resistance states of such a programmable resistor can be programmed to a maximum resistance state, to a minimum resistance state, and optionally to one or more resistance states along a continuum between the minimum and maximum resistance states. In some cases, the programmable resistors could have a significantly large number of different stable resistance states (e.g., 16 or more).

FIGS. 3A-3D illustrate an RRAM-type programmable resistor that could be employed in a memory element 110, 210 as the programmable resistor(s) 111, 211-212. An RRAM is typically a back end of the line (BEOL) multi-layered structure, which includes two metallic layers 312 and 314 separated by a dielectric region 313 (also referred to herein as a resistance switching region). Depending upon the specific materials used and on the biasing conditions applied to the opposing end terminals 321-322 of such a resistor during a write operation, metal ions migrate to: (a) grow conductive filament(s) 315 in the dielectric region 313 extending between the metallic layers 312 and 314 so that the resistance state of the RRAM-type programmable resistor decreases or (b) break down conductive filament(s) within the dielectric region 313 between the metallic layers 312 and 314 so that the resistance state of the RRAM-type programmable resistor increases. Those skilled in the art will recognize that the total number of stable resistance states achievable with such an RRAM-type programmable resistor can vary depending upon the materials used and the biasing conditions. An RRAM-type programmable resistor could include metallic layers 312-314 (e.g., of platinum (Pt), titanium (Ti), titanium nitride (TiN), etc.) and, between the metallic layers 212-214, a dielectric region 313 including an oxide layer, such as a tantalum oxide ($Ta_2O_5$) layer, a hafnium oxide ($HfO_2$) layer, an iron oxide ($Fe_2O_3$) layer, a titanium oxide ($TiO_2$) layer, etc. However, the addition of one or more thin interface barrier layers (e.g., a second oxide layer, such as aluminum oxide ($Al_2O_3$) or some other oxide layer, an amorphous silicon layer, or some other suitable interface barrier layer) between the oxide layer and one or both metallic layers can improve the switching characteristics and increase the number of different detectable stable resistance states between a minimum resistance state and a maximum resistance state.

Figure 4A:
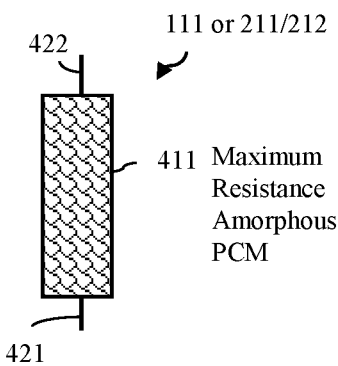
FIGS. 4A-4B are cross-section diagrams illustrating some resistance states of a phase change memory (PCM)-type programmable resistor that could be incorporated into the disclosed structure embodiments.
Figure 4B:
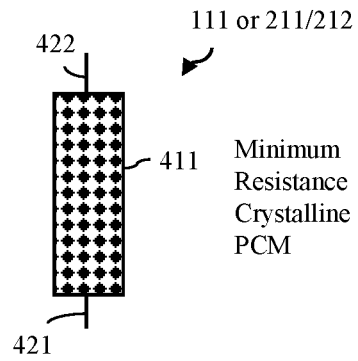

FIGS. 4A-4B illustrate a PCM-type programmable resistor that could be employed in a memory element 110, 210 as the programmable resistor(s) 111, 211-212. A PCM-type programmable resistor includes a phase change material 411 (e.g., a chalcogenide compound) with programmable structural phases that exhibit different stable resistance states. For example, in a fully amorphous phase, exemplified by the drawing shown in FIG. 4A, the resistor will have the maximum resistance, whereas in a fully crystalline phase, exemplified by the drawing shown in FIG. 4B, the resistor will have the minimum resistance. In any phase between the fully amorphous phase and the fully crystalline phase (i.e., a partially amorphous and partially crystalline structure) the resistor will have a resistance between the maximum and the minimum resistances. Phase changes are dependent upon the local temperature of the PCM, which is controlled by the length and strength of an applied voltage. For example, changing from a crystalline phase toward or to an amorphous phase can be achieved by applying a short high voltage pulse to one or both of the opposing end terminals 421-422 in order to quickly heat the phase change material above its melting point, whereas changing from an amorphous phase toward or to a crystalline phase can be achieved by applying a longer lower voltage pulse to one or both of the opposing terminals 421-422 in order to heat the phase change material to its crystallization temperature and then allowing it to cool.

Figure 5A:
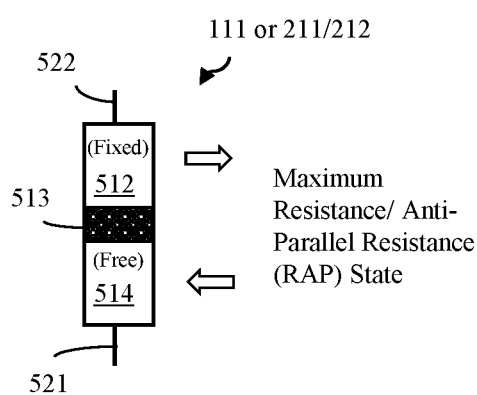
FIGS. 5A-5B are cross-section diagrams illustrating some resistance states of a magnetic tunnel junction (MTJ)-type programmable resistor that could be incorporated into the disclosed structure embodiments.
Figure 5B:
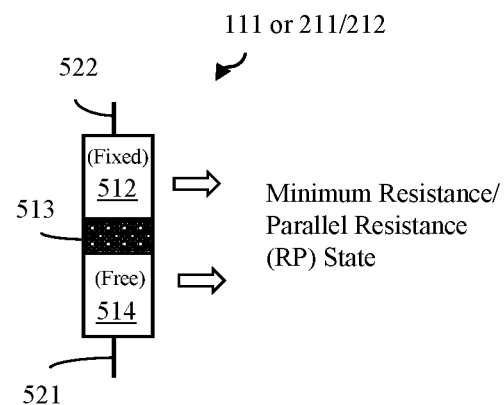

FIGS. 5A-5B illustrate an MTJ-type programmable resistor that could be employed in a memory element 110, 210 as the programmable resistor(s) 111, 211-212. An MTJ-type programmable resistor is typically a back end of the line (BEOL) multi-layered structure, which includes a free ferromagnetic layer 514 (also referred to as a switchable layer) at a first terminal 521, a fixed ferromagnetic layer 512 (also referred to as a pinned layer) at a second terminal 522, and a thin dielectric layer 513 (e.g., a thin oxide layer) between the free ferromagnetic layer 514 and the fixed ferromagnetic layer 512. Depending upon the biasing conditions on the two terminals 521-522 and, particularly, depending on the voltage differential between the two terminals during a write operation, the MTJ-type programmable resistor can exhibit different stable resistance states. For example, during a write operation, a high positive voltage (Vcc) can be applied to the second terminal 522 and the first terminal 521 can be discharged to ground (e.g., at 0V). In this case, the free ferromagnetic layer 514 switches to (or maintains) the anti-parallel resistance (RAP) state (also referred to as a high resistance state) (see FIG. 5A). Alternatively, during the write operation, Vcc can be applied to the first terminal 521 and the second terminal 522 can be discharged to ground (e.g., at 0V). In this case, the free ferromagnetic layer 514 switches to (or maintains) a parallel resistance (RP) state (also referred as a low resistance state) (see FIG. 5B). The MTJ structure described above has two resistance states. However, the example is not intended to be limiting and those skilled in the art will recognize that MTJ-type programmable resistors have been developed that can exhibit more than two different resistance states.

Referring again to FIGS. 1 and 2, in each memory element 110, 210, one terminal of each programmable resistor (e.g., the input terminal of the programmable resistor 111 or the input terminals of both the first and second programmable resistors 211-212) can be electrically to a corresponding input node 119, 219 (either directly or indirectly through an amplifier 115, 215 or voltage buffer 116, 216, as discussed in greater detail below). The output terminal of each programmable resistor can be connected to a bitline with the output terminals of the programmable resistors in a dual resistor memory element being connected to different bitlines. That is, each memory bank can include one or more bitlines and the number of bitlines per memory bank can be equal to the number of programmable resistors per memory element. Thus, as illustrated, each memory element 110 in the structure 100 of FIG. 1 has a single programmable resistor with an input terminal connected to an input node 119 and an output terminal connected to a bitline 101, whereas each memory element 210 in the structure 200 of FIG. 1 has first and second programmable resistors 211-212 having input terminals connected to the same input node 219 and output terminals connected to different bitlines and, particularly, to first and second bitlines 201-202, respectively (as discussed in greater detail below).

For in-memory pipeline processing (e.g., MAC processing), the structure 100, 200 can operate in a normal operational mode (also referred to herein as the mission mode). During the normal operational mode, each memory element 110, 210 has already been pre-programmed (i.e., any programmable resistor therein has already been programmed to a desired resistance state).

For example, in the structure 100 of FIG. 1, each memory element 110 has already been pre-programmed store a total weight value (also referred to herein as a total data value or a specific total weight value) as a function of the specific resistance state of the programmable resistor 111. Also, for example, in the structure 200 of FIG. 2, each dual resistor memory element 210 has been pre-programmed to store a total weight value as a function of the resistance states of the first and second programmable resistors 211-212 therein. That is, in the memory element 210 in the structure 200 of FIG. 2, the first programmed resistance state of the first programmable resistor 211 can be representative of a positive weight value, the second programmed resistance state of the second programmable resistor 212 can be representative of a negative weight value, and the total weight value stored in the dual resistor memory element 210 can be a function of the first programmed resistance state (i.e., the positive weight value) and the second programmed resistance state (i.e., the negative weight value). That is, the total weight value stored in the memory element 210 can be essentially equal to the difference between the positive weight value corresponding to the first resistance state of the first programmable resistor and the negative weight value corresponding to the second resistance state of the second programmable resistor. Preferably, at least one of the two programmable resistors 211-212 in each dual resistor memory element 210 can be pre-programmed to have a maximum resistance state, which is representative of no weight value. Thus, the total weight value stored in any given dual resistor memory element 210 will be equal to either the specific positive weight value represented by the programmed first resistance state of the first programmable resistor 211 (if the second programmable resistor 212 is programmed to the maximum resistance state) or the specific negative weight value represented by the programmed second resistance state of the second programmable resistor 212 (e.g., if the first programmable resistor 211 is programmed to the maximum resistance state). Alternatively, both programmable resistors can be programmed to have some weight value.

The memory elements 110, 210 of the structure 100, 200 can be arranged in a memory element array. The full size of the memory element array (i.e., the number of columns and rows of memory elements in the memory element array) can depend upon the application. Relatively complex neural networks (e.g., for image processing, for audio processing, or the like) can require a relatively large memory element array to complete in-memory processing (e.g., including 10's or 100's of memory elements per row and column in the dual resistor memory element array).

In any case, in the structure 100, 200 the memory element array is partitioned (i.e., is a partitioned array). Specifically, each column of memory elements in the dual resistor memory element array is partitioned into two or more smaller groups (also referred to herein as sub-columns). For purposes of this disclosure, each partition (or section) of a memory element array that includes such a sub-column is referred to herein as a memory bank 199, 299.

With partitioning as described above, the structure 100, 200 includes an array 190, 290 of memory banks 199, 299 (i.e., partitions or sections) that are arranged columns (C0-Cy) and rows (R0-Rx). Since only the columns of the memory elements from the memory element array are partitioned, the total number of columns (C) of memory banks 199, 299 within the memory bank array 190 is the same as the total number of columns of memory elements from the pre-partitioned memory element array.

In some embodiments, each memory bank 199, 299 can have the same number (m+1) of multiple rows (r0-rm) of memory elements 110, 210 therein and the total number of memory banks 199, 299 in each column times the total number of rows of memory elements 110, 210 in each memory bank 199, 299 can be equal to the total number of rows of memory elements 110, 210 as in the memory element array prior to partitioning. Thus, for example, if a 64×64 memory element array is partitioned in the structure 100, 200, there will be 64 columns (C0-C63) of memory banks and x+1 rows (R0-Rx) of memory banks 199, 299, each with m+1 rows (r0-rm) of memory elements 110, 210, where x≥1 and m≥1, where 64 is divisible by x+1, and where the number m+1 is a whole number equal to 64/x+1. That is, the number of rows (R0-Rx) of memory banks 199, 299 could be 2 with each memory bank 199, 299 having 32 rows (r0-rm) of memory elements 110, 210; the number of rows (R0-Rx) of memory banks 199, 299 could be 4 with each memory bank 199, 299 having 16 rows (r0-rm) of memory elements 110, 210; the number of rows (R0-Rx) of memory banks 199, 299 could be 8 with each memory bank having 8 rows (r0-rm) of memory elements 110, 210; and so on. Similarly, if a 128×128 memory element array is partitioned in the structure 100, 200 there will be 128 columns (C0-C127) of memory banks 199 and x+1 rows (R0-Rx) of memory banks 199 with m+1 rows (r0-rm) of memory elements 110, 210 in each memory bank 199, 299, where x≥1 and m≥1, where 128 is divisible by x+1, and where the number m+1 is a whole number equal to 128/x+1. If a 256×256 memory element array is to be partitioned in the structure 100, 200, there will be 256 columns (C0-C255) of memory banks 199, 299 and x+1 rows (R0-Rx) of memory banks 199, 299 with m+1 rows (r0-rm) of memory elements 110, 210 in each memory bank 199, 299, where x≥1 and m≥1, where 256 is divisible by x+1, and where the number m+1 is a whole number equal to 256/x+1, and so on. For purposes of illustration, a 2×2 memory bank array with only three rows of memory elements per memory bank is shown in the figures.

However, in the disclosed embodiments partitioning of the columns of memory elements of a memory element array into memory banks is performed by designers to minimize the effect of wiring resistance across the array. Thus, there is no requirement for uniform partitioning. For example, in some embodiments each memory bank could have the maximum number of rows necessary before buffering becomes necessary with the last memory bank in each column having some lessor number of rows to include. In other embodiments, the number of rows in each memory back in each column can drop (with each memory bank or with each group of memory banks) between the first memory bank in the column to the last memory bank in the column. Therefore, it should be understood that the figures are not intended to be limiting. Alternatively, the memory bank array 190, 290 in the structure 100, 200 could include any number of two or more columns (C0-Cy) of memory banks 199, 299 and any number of two or more rows (R0-Rx) of memory banks 199, 299 with any number of two or more rows (r0-rm) in any given memory bank within each column with the number of rows in each memory bank in each column being the same or different.

In any case, each memory bank 199, 299 can include a sub-column of memory elements 110, 210, as discussed above. Each memory bank 199, 299 can further include corresponding input nodes 119, 219, one for each memory element 110, 210 in the sub-column. Each memory bank 199, 299 can further include one or more bitlines and, particularly, the same number of bitlines as there are programmable resistors in each memory element 110, 210.

Thus, in the structure 100 of FIG. 1, each memory bank 199 can include a single bitline 101. The programmable resistor 111 of each memory element 110 in the sub-column of a memory bank can have an input terminal connected to the corresponding input node 119 directly (or, indirectly via an amplifier 115 or voltage buffer 116, as discussed below), and an output terminal connected to the bitline 101. In the structure 200 of FIG. 2, each memory bank 299 can include two bitlines and, particularly, a first bitline 201 and a second bitline 202. The first programmable resistor 211 and the second programmable resistor 212 of each dual resistor memory element 210 in the sub-column of a memory bank can have their respective input terminals connected to each other and to the corresponding input node 219 directly (or, indirectly via an amplifier 215 or voltage buffer 216, as discussed below), and their respective output terminals connected to the first bitline 201 and the second bitline 202, respectively.

The discussion below refers to initial memory banks in the rows (R0-Rx) of memory banks. The initial memory banks refer to the first memory banks 199, 299 at the beginning of each row (R0-Rx) of memory banks 199, 299 within the first column (C0). Within the structure 100, 200, each initial memory bank can include THs 170, multiplexors (MUXs) 118, 218 and amplifiers 115, 215. Specifically, in each initial memory bank 199, 299 in the structure 100, 200, each amplifier 115, 215 is connected between one of the input nodes 119, 219 and one of the memory elements 110, 210 and, more particularly, each amplifier 115, 215 has an input connected to one of the input nodes 119, 219 and an output connected to the input terminal(s) of the programmable resistor(s) 111, 211-212 of one of the memory elements 110, 210. In each initial memory bank 199, 299, each MUX 118, 218 is a multi-input/single-output MUX with the single output connected to one of the input nodes 119, 219 and the multiple inputs including at least a first input connected to a corresponding TH 170, 270 and a second input connected to a global calibration supply line 175, 275.

The structure 100, 200 can be operated in a normal operational mode for in-memory processing. In this mode, the MUXs 118, 218, in response to a control signal, connect the first inputs and, thereby the THs 170, 270 to the input nodes 119, 219 of the initial memory banks. The structure 100, 200 can alternatively be operated in a calibration mode for calibration processing. In this mode, the MUXs 118, 218, in response to a control signal, connect the second inputs and, thereby the global calibration supply line 175, 275 to the input nodes.

During the normal operation mode in the structures 100-200 of FIGS. 1-2 (i.e., when the THs 170, 270 are connected by the MUXs 118, 218 to the amplifiers 115, 215 in response to specific control bits 113, 213 for in-memory pipeline processing), data input voltages can be sampled by the THs 170, 270 and received at the corresponding input nodes 119, 219 via the MUXs 118, 218 (e.g., $V0_{R0}$ at the first row (r0) in the bank R0:C0, $V1_{R0}$ at the second row (r1) in the bank R0:C0; and so on). The specific data input voltages can, for example, correspond to specific activation values.

Those skilled in the art will recognize that a TH refers to an analog device that samples the voltage of a variable analog signal (e.g., in response to a control signal, such as a clock signal or some other control signal) and stores its value for some period of time (e.g., dependent upon the control signal). Each TH 170, 270 can, as illustrated, include a switch 171, 271 (e.g., a transistor-based switch or some other suitable switch) and a capacitor 172, 272. The switch 171, 271 can be connected on one side to an analog voltage terminal and on the opposite side to a track node (e.g., at the input node 119, 219 for the memory element 110, 210). The capacitor 172, 272 can be connected between the track node and ground. Such a TH 170, 270 can be configured so that it is operable in a track mode or a hold mode. In a track mode, the switch 171, 271 connects the analog voltage terminal to the track node and the capacitor 172, 272 stores a stored voltage equal to the sampled analog voltage at the analog voltage terminal. In a hold mode, the switch 171, 271 disconnects the analog voltage terminal from the track node such that variations in the analog voltage do not impact circuit operation. It should be understood that the TH structure described above and illustrated in the drawings is not intended to be limiting. Alternatively, any other suitable TH device, which is configured for track-and-hold operations as described above, could be employed. As discussed in greater detail below, the THs 170, 270 enable pipeline processing. Additionally, such THs can enable interruptions in normal operations (e.g., mid-stream) to preform maintenance operations (e.g., calibration, refreshment programming, etc.) without resulting in data loss.

Each amplifier 115, 215 can be connected to enable receipt of a specific data input voltage from a TH 170, 270 and can be configured to generate and output a level shifted data input voltage 114, 214 that is essentially equal to the sum of the specific data input voltage and a virtual ground voltage (Vvg), as discussed in greater detail below. That is, the amplifier 115, 215 adds Vvg to the specific data input voltage. For example, the first amplifier 115, 215 in Bank R0:C0 that receives $V0_{R0}$ can generate and output a level shifted data input voltage 114, 214 equal to $V0_{R0}$ plus Vvg, the next amplifier 115, 215 in Bank R0:C0 that receives $V1_{R0}$ can generate and output a level shifted data input voltage 114, 214 equal to $V1_{R0}$ plus Vvg, and so on with the last amplifier 115, 215 in Bank Rx:C0 generating and outputting a level shifted data input voltage 114, 214 equal to $Vm_{Rx}$ plus Vvg. The level shifted data input voltage 114, 214 output from any given amplifier 115, 215 will be applied to the memory element 110, 210 (e.g., to the input terminal of the programmable resistor 111 of the memory element 110; to the input terminals of the first and second programmable resistors 211-212 of that memory element 110, 210).

Those skilled in the art will recognize that Vvg is used in analog circuits to refer to a voltage, which is established on a node, which has a certain DC bias that is maintained at a steady reference potential without being connected directly to that reference potential, and which has 0V from an AC perspective. Vvg is typically established on a node to essentially function as a "ground" terminal that is level shifted by a fixed DC amount. For example, amplifiers can be configured in a negative feedback loop to force their negative input voltage to be equal to the positive input voltage. In this context, the negative input voltage is referred to as Vvg because there is effectively no potential difference between it and the positive terminal. Alternatively, Vvg could be established with a large capacitor which holds a DC voltage and essentially has zero AC across it. Each amplifier 115, 215 can be a simple voltage level shifter (also referred to herein as a level shifting amplifier). Alternatively, each amplifier 115, 215 can be configured as a multistate amplifier, where the output state of any given amplifier 115, 215 is controlled by a unique control bit 113, 213 for that amplifier (e.g., control bit $S0_{R0}$ for the amplifier 115, 215 in the first row of the first initial memory bank R0:C0, control bit $S1_{R0}$ for the amplifier 115, 215 in the next row of the first initial memory bank R0:C0, and so on until the last control bit Sm RX for the amplifier 115, 215 of the last row of the last initial memory bank Rm:C0). In this case, depending upon the control bit received, an amplifier 115, 215 can output a level shifted data input voltage (e.g., during the normal operational mode) or some other suitable output, such as a low output (e.g., ground), a high output (e.g., Vcc), or a high impedance (HiZ) output. Different outputs, such as a low voltage, a high voltage, or a HiZ output, could facilitate other operational modes such as program or erase operations, as described in greater detail below.

The structure 100, 200 can further include sets of row interconnect lines 155, 255. Each set of row interconnect lines 155, 255 can interconnect adjacent memory banks within the same row (R0-Rx) of memory banks. Specifically, each row interconnect line 155, 255 within a set between adjacent memory banks of a given row of memory banks can connect the input terminal(s) of the programmable resistor(s) on one memory element 110, 210 at a particular bank row address (e.g., r0-rm) in an upstream memory bank to the input node for another memory element at the same bank row address in an adjacent downstream memory bank. Thus, for example, if the structure 100, 200 only includes two columns of memory banks (e.g., if C0 is the initial memory bank in a given row of memory banks and Cy is the next and last memory bank in the same row), the first row interconnect line 155 in the set between Bank R0:C0 and Bank R0:Cy would connect the connected input terminal(s) of the programmable resistor(s) of the memory element 110, 210 in row r0 of Bank R0:C0 to the input node 119, 219 for the memory element 110, 210 in row r0 of the adjacent downstream Bank R0:Cy, the second row interconnect line 155, 255 in the set between Bank R0:C0 and Bank R0:Cy would connect the connected input terminal(s) of the programmable resistor(s) of the memory element 110, 210 in row r1 of Bank R0:C0 to the input node 119, 219 for the memory element 110, 210 in row r1 of the downstream Bank R0:Cy, and so on. Thus, the level shifted input voltages generated by the amplifiers in the initial memory banks are transmitted along row interconnect lines to memory elements at the same address in the downstream memory banks within the same row.

Optionally, to minimize IR drops across the row interconnect lines as the level shifted data input voltages are communicated to each memory element at the same address in each memory bank in the same row, some embodiments of the disclosed structure can include optional voltage buffers 116, 216 (also referred to herein as voltage boost amplifiers). For example, if the size of the array of memory banks is relatively large and, particularly, if the number of columns (C0-Cy) is so large that significant IR drops are exhibited along the row interconnect lines 155, 255, then at least some of memory banks 199, 299 can have integrated voltage buffers 116, 216 (e.g., between the input nodes 119, 219 and the memory elements 110, 210) to buffer the level shifted data input voltages and, thereby compensate for IR drops.

As mentioned above, each memory bank 199, 299 can further include at least one bitline. For example, in the structure 100 of FIG. 1, each memory bank 199 can have a single bitline 101 and the programmable resistor 111 of each memory element 110 in the memory bank 199 can have an input terminal connected to a corresponding input node 119 (e.g., either directly or indirectly via an amplifier 115 or voltage buffer 116) and an output terminal connected to a bitline 101. In the structure 200 of FIG. 2, each memory bank 299 can have a first bitline 201 and a second bitline 202 and the first programmable resistor 211 and the second programmable resistor 212 of each dual resistor memory element 210 within the memory bank 299 can have their respective input terminals connected to each other and to the corresponding input node 219 (e.g., either directly or indirectly via an amplifier 215 or voltage buffer 216) and their respective output terminals connected to the first bitline 201 and the second bitline 202, respectively.

Each memory bank 199, 299 can further include the following for each bitline, 101, 201 and 202: a bias node, an output node, and a feedback buffer circuit. Specifically, each memory bank 199 in the structure 100 of FIG. 1 can include a bias node 133 at one end of the bitline 101, an output node 135, and a feedback buffer circuit 120, which is connected to the bias node 133 and the output node 135. The feedback buffer circuit 120 can include, for example, a first transistor 131 (e.g., a first P-type field effect transistor (first PFET)) connected in series between the bias node 133 and the output node 135 and a buffer amplifier 121, which has one input connected to the bias node 133, another input connected to receive Vvg, and an output connected to the gate of the PFET 131. Similarly, each memory bank 299 of the structure 200 of FIG. 2 can include a first bias node 233 on the first bitline 201, a first output node 235, and a first feedback buffer circuit 220.1, which is connected to the first bias node 233 and to the first output node 235. The first feedback buffer 220.1 circuit can include, for example, a first transistor 231 (e.g., a first P-type field effect transistor (first PFET)) connected in series between the first bias node 233 and the first output node 235 and a first buffer amplifier 221, which has one input connected to the first bias node 233, another input connected to receive Vvg, and an output connected to the gate of the first PFET 231. Additionally, each memory bank 299 can further include a second bias node 234 on the second bitline 202, a second output node 236, and a second feedback buffer circuit 220.2, which is connected to the second bias node 234 and to the second output node 236. The second feedback buffer circuit 220.2 can specifically include a second transistor 232 (e.g., a second PFET) connected in series between the second bias node 234 and the second output node 236 and a second buffer amplifier 222, which has one input connected to the second bias node 234, another input connected to receive Vvg, and an output connected to the gate of the second PFET 232.

With the above-described feedback buffer circuit(s) in each memory bank 199, 299, when the structure 100, 200 is in the normal operational mode for in-memory processing, the bias node on each bitline can be biased to Vvg. Additionally, as mentioned above, the level shifted data input voltages, which have each been level shifted by Vvg and which are output by the amplifiers 115, 215 of the initial memory banks, are received at the input terminals of the memory elements 110, 210 in the initial memory banks and further received at the input nodes for the memory elements 110, 210 in the downstream memory banks. As a result, the voltage across the programmable resistor(s) 111, 211-212 of each memory element 110, 210 at the same bank row address in the memory banks within the same row will be essentially equal to the received data input voltage. Additionally, output currents from the programmable resistor(s) in each memory bank are output to and summed on the bitline(s) for that memory bank. For example, in each memory bank 199 in the structure 100 of FIG. 1, during the normal operational mode, output currents from all programmable resistors 111 of all memory elements 110 in any specific memory bank are output to and summed on the bitline 101, thereby generating a bank-specific output current (I). This bank-specific output current is further buffered by the feedback buffer circuit 120 such that a buffered bank-specific output current (bI), which is dependent on the sum of all output currents from all programmable resistors 111 of all memory elements 110 in the specific memory bank, is output on the output node 135 for the specific memory bank. Similarly, in each memory bank 299 in the structure 200 of FIG. 2, during the normal operational mode, first output currents from all first programmable resistors 211 of all dual resistor memory elements 210 in any specific memory bank are output to and summed on the first bitline 201, thereby generating a bank-specific first output current (I1). This bank-specific first output current is further buffered by the first feedback buffer circuit 220.1 such that a buffered bank-specific first output current (bI1), which is dependent on the sum of all first output currents from all first programmable resistors 211 of all dual resistor memory elements 210 in the specific memory bank, is output on the first output node 235 for the specific memory bank. Similarly, second output currents from all second programmable resistors 212 of all dual resistor memory elements 210 in the same specific memory bank are output to and summed on the second bitline 202, thereby generating a bank-specific second output current (I2). This bank-specific second output current (I2) is further buffered by the second feedback buffer circuit 220.2 such that a buffered bank-specific second output current (bI2), which is dependent on the sum of all the second output currents from each second programmable resistor 212 of each dual resistor memory element 210 in the specific memory bank, is output on the second output node 236 of the specific memory bank.

The structure 100, 200 can further include column interconnect line(s) for the columns, respectively. For example, the structure 100 can include a column interconnect line 151 for each column and electrically connected to all output nodes 135 of all memory banks 199 in that column. That is, the column interconnect line 151 for column C0 will be connected to the output nodes 135, respectively, of all memory banks in the column C0 (i.e., for Banks R0:C0-Rx:C0), and so on. When the structure 100 is in the normal operational mode for in-memory processing, the column interconnect line 151 for any specific column can receive and sum the buffered bank-specific output currents from all the memory banks in that specific column, thereby generating a column-specific output current (e.g., $tbI_{C0}=bI_{R0:C0}+\ldots+bI_{Rx:C0}; \ldots;$ and $tbI_{Cy}=bI_{R0:Cy}+\ldots+bI_{Rx:Cy}$). Similarly, the structure 200 of FIG. 2 can include a pair of column interconnect lines for each column. Each pair of column interconnect lines can include a first column interconnect line 251, which is electrically connected to all first output nodes 235 of all memory banks 299 in the same column, and a second column interconnect line 252 connected to all second output nodes 236 of all memory banks in the same column. That is, the first and second column interconnect lines 251-252 for column C0 will be connected to the first and second output nodes 235-236, respectively, of all memory banks in the column C0 (i.e., for Banks R0:C0-Rx:C0), and so on. When the structure 200 is in the normal operational mode for in-memory processing, the first column interconnect line 251 for any specific column can receive and sum the buffered bank-specific first output currents from all the memory banks in that specific column, thereby generating a column-specific first output current (e.g., $tbI1_{C0}=bI_{R0:C0}+\ldots+bI_{Rx:C0}; \ldots;$ and $tbI1_{Cy}=bI1_{R0:Cy}+\ldots+bI1_{Rx:Cy}$). Similarly, the second column interconnect line 252 for the specific column can receive and sum the buffered bank-specific second output currents from all the memory banks in the specific column, thereby generating a column-specific second output current (e.g., $tbI2_{C0}=bI2_{R0:C0}+\ldots+bI2_{Rx:C0}; \ldots;$ and $tbI2_{Cy}=bI2_{R0:Cy}+\ldots+bI2_{Rx:Cy}$). In each of these structures 100 and 200, by buffering the bank-specific output currents output to each column interconnect line the impact of wiring resistance across the length of the columns is diminished.

The structure 100, 200 can further include data sensing elements 185, 285 at the end of each column and, optionally, analog-to-digital converters (ADCs) 187, 287 connected to the data sensing elements 185, 285, respectively.

For example, the structure 100 of FIG. 1 can further include data sensing elements 185 and, particularly, current-to-voltage converters (also referred to herein as converters or current-to-voltage converter circuits) for each column. Each current-to-voltage converter can be connected to the column interconnect line 151 for that column, can receive the column-specific output current from the column interconnect line 151, and can generate and output a column-specific analog output voltage 189 based on the column-specific output current. Since output currents from memory elements 110 in each memory bank are generated on the bitline 101 in the memory bank as a function of programmed resistance states representing a weight value and on received data input voltages representing activation values, the column-specific output current on each column interconnect line 151 can represent a current value solution for a dot product computation and the column-specific analog output voltage can represent a voltage value solution for that dot product computation.

FIGS. 6A-6E are schematic diagrams illustrating converters 185, respectively, that could be incorporated into the structure 100.

Figure 6A:
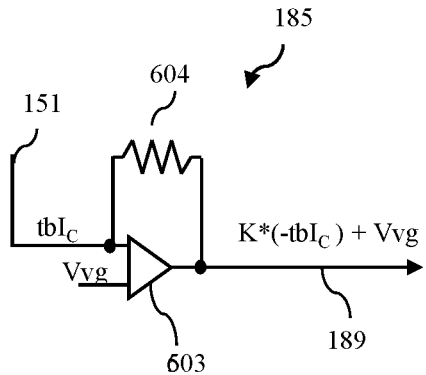
FIGS. 6A-6E are schematic diagrams illustrating current-to-voltage converters that could specifically be incorporated into the structure of FIG. 1.

The current-to-voltage converter 185 of FIG. 6A includes an amplifier 603 and a feedback resistor 604. The amplifier 603 has a first input connected to the column interconnect line 151, a second input connected to receive Vvg, and an output. The feedback resistor 604 is connected between the output and the first input of the amplifier. The feedback resistor 604 can be the same type of programmable resistor as that used in the memory elements. It should be noted that the polarity of the column-specific analog output voltage 189 from the amplifier 603 will be the opposite of that of the column-specific output current on the column interconnect line 151.

Figure 6B:
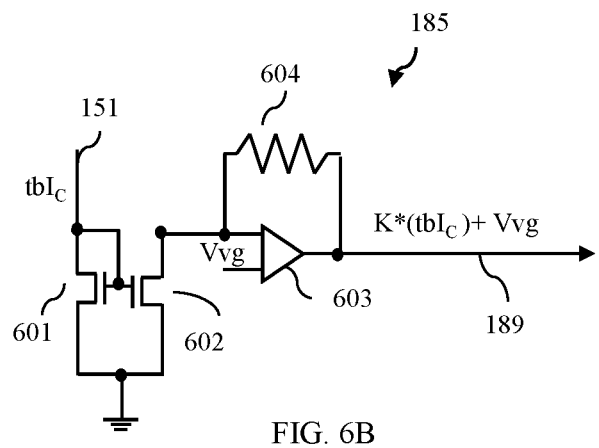

The current-to-voltage converter 185 of FIG. 6B is similarly to the current-to-voltage converter of FIG. 6A but includes additional circuitry to ensure the polarity of the column-specific output current on the column interconnect line and the column-specific output voltage are the same. That is, the current-to-voltage converter 185 includes a first stage and a second stage. The first stage includes first and second n-type field effect transistors (NFETs) 601-602 and the second stage includes the amplifier 603 and the feedback resistor 604. The first NFET 601 is connected in series between the column interconnect line 151 and ground. The second NFET 602 is connected in series between the first input of the amplifier 603 and ground. The drain node of the first NFET 601 can control the gates of the first and second NFETs 601-602.

Figure 6C:
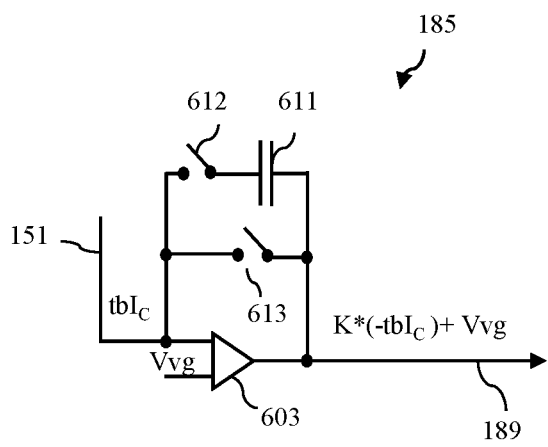

The current-to-voltage converter 185 of FIG. 6C includes the amplifier 603, but instead of a feedback resistor, it can include a feedback switched capacitor circuit. Specifically, the amplifier 603 has a first input connected to the column interconnect line 151, a second input connected to receive Vvg, and an output. The feedback switched capacitor circuit includes a capacitor 611 that is connected to the output of the amplifier 603 and further connected by a first switch 612 to the first input. The feedback switched capacitor circuit can also include a bypass switch 613 that connects the output to the first input of the amplifier 603, bypassing the capacitor 611. In operation, initially the bypass switch 613 is closed to stabilize the high impedance node at Vvg. Then, the bypass switch 613 is opened and there will be a finite integration time across the capacitor 611. This integration time can be made to be proportional to the temperature coefficient of a programmable resistor used in the memory elements. Alternatively, the integration time can be made proportional to a resistor that is made of the same material as the programmable resistors and whose value at the typical temperature of operation is fixed. For example, a resistor value can be selected that has a nominal resistor value representative of the variety of resistor values that can appear in the programmable resistors within the array. That is, if the programmable resistors within the array can have values between 20 k and 500 k, then a nominal resistor value (e.g., 50 k) can be selected based on simulations and measurements to minimize the impact of the TCs of the resistors used in the array. It should be noted that this integration time will also determine the magnitude of the output signal and will compensate for the temp-coefficient. Furthermore, due to the switched capacitor circuit configuration, the value of the output can be held for some duration of time (e.g., track-and-hold circuit), the capacitor 611 can reference some other bias potential, and the power for the op-amp can be turned off to save power. It should be noted that the polarity of the column-specific analog output voltage 189 from the amplifier 603 will be the opposite that of the column-specific output current on the column interconnect line 151.

Figure 6D:
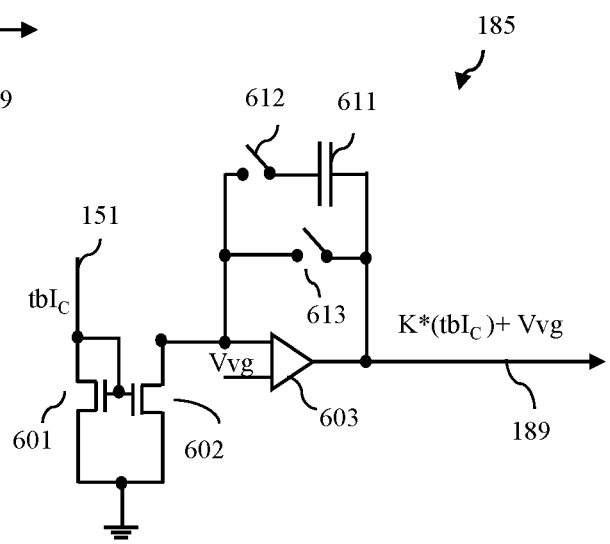

The current-to-voltage converter 185 of FIG. 6D is similar to the current-to-voltage converter of FIG. 6C but includes additional circuitry to ensure the polarity of the column-specific output current on the column interconnect line and the column-specific output voltage are the same. Specifically, in this case the current-to-voltage converter includes a first stage and a second stage. The first stage includes first and second n-type field effect transistors (NFETs) 601-602 and the second stage includes the amplifier 603 and the feedback resistor 604. The first NFET 601 is connected in series between the column interconnect line 151 and ground. The second NFET 602 is connected in series between the first input of the amplifier 603 and ground. The drain node of the first NFET 601 can control the gates of the first and second NFETs 601-602.

Figure 6E:
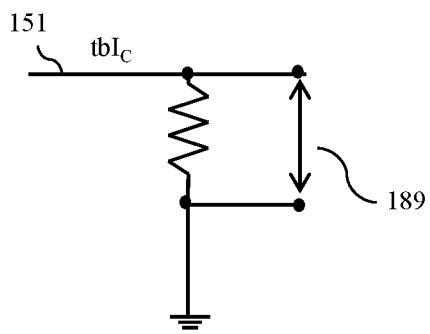

The current-to-voltage converters described above and illustrated in FIGS. 6A-6D are provided for illustration purposes and are not intended to be limiting. Alternatively, any other suitable current-to-voltage converter circuit could be incorporated into the structure 100 as a data sensing element. For example, the current-to-voltage converter could, alternatively, be in the form of a simple resistor connected between the column interconnect line and ground, as shown in FIG. 6E.

The structure 200 of FIG. 2 can include data sensing elements 285 and, particularly, subtractors (also referred to herein as subtractor circuits). Each subtractor 285 for each column can be connected to the pair of the column interconnect lines 251-252 for that column, can receive the column-specific first output current from the first column interconnect line 251 and the column-specific second output current from the second column interconnect line 252 (e.g., $tbI1_{C0}$ and $tbI2_{C0}$; . . . ; and $tbI1_{Cy}$ and $tbI2_{Cy}$, respectively), and can generate and output a column-specific analog output parameter 289 (e.g., a column-specific analog output voltage ($Vout_{C0-y}$) or column-specific analog output current ($Iout_{C0-y}$)) based on the difference between the column-specific first output current and the column-specific second output current (e.g., $Vout_{C0}$ or $Iout_{C0}$ as a function of $tbI1_{C0}$–$tbI2_{C0}$; . . . ; and $Vout_{Cy}$ or $Iout_{Cy}$ as a function of $tbI1_{Cy}$–$tbI2_{Cy}$, respectively). Since each first output current is generated on a first bitline 201 in a memory bank as a function of a first programmed resistance state representing a positive weight value and a data input voltage that represents an activation value and since each second output current is generated on the second bitline 202 in each memory bank as a function of a second programmed resistance state representing a negative weight value and the same data input voltage, the column-specific first output current can represent a solution for a positive side of a dot product computation, the column-specific second output can represent a solution for a negative side of a dot product computation, and the column-specific analog output parameter (e.g., the analog output voltage) can represent the combined solution for the dot product computation.

Figure 7A:
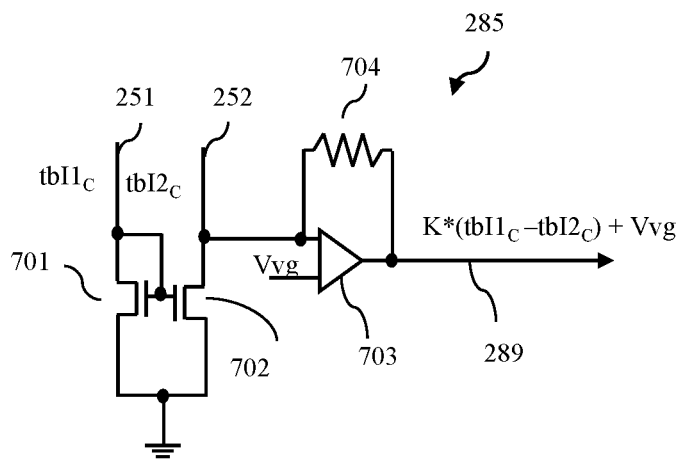
FIGS. 7A-7B are schematic diagrams illustrating subtractor circuits that could specifically be incorporated into the structure of FIG. 2.
Figure 7B:
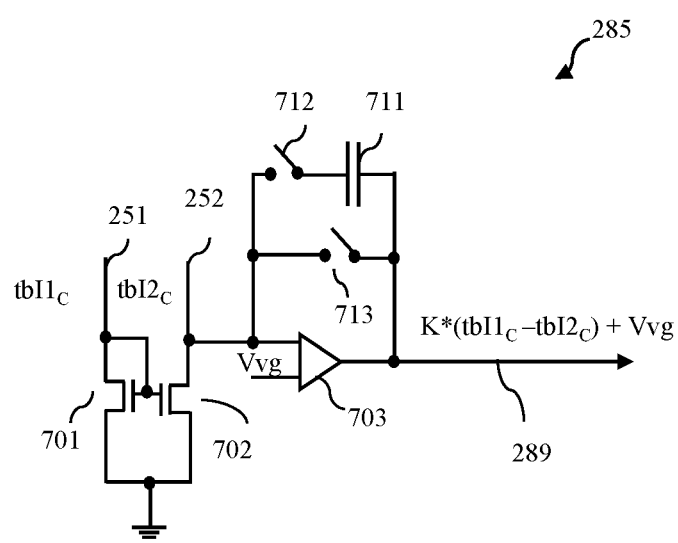

FIGS. 7A-7B are schematic diagrams illustrating subtractors 285, respectively, that could be incorporated into the structure 200.

The subtractor circuit 285 of FIG. 7A includes a first stage and a second stage. The first stage includes first and second n-type field effect transistors (NFETs) 701-702 connected in series between the first and second column interconnect lines 251-252, respectively, of a given column and ground. The drain node of the first NFET 701 control the gates of the first and second NFETs 701-702. The second stage includes an amplifier 703 and a feedback resistor 704. The amplifier has a first input connected to the drain node of the second NFET 702, a second input connected to receive Vvg, and an output. The feedback resistor 704 is connected between the output and the first input of the amplifier. The feedback resistor 704 can be the same type of programmable resistor used in the memory elements 210.

The subtractor circuit of FIG. 7B similarly includes a first stage and a second stage. The first stage of FIG. 7B is essentially the same as the first stage in FIG. 7A, as discussed above. The second stage includes an amplifier 503, but instead of a feedback resistor, it includes a feedback switched capacitor circuit. Specifically, the amplifier 703 has a first input connected to the drain node of the second NFET 702, a second input connected to receive Vvg, and an output. The feedback switched capacitor circuit includes a capacitor 711 that is connected to the output of the amplifier 703 and further connected by a first switch 712 to the first input. The feedback switched capacitor circuit includes a bypass switch 713 that connects the output to the first input of the amplifier 703, bypassing the capacitor 711. In operation, initially the bypass switch 713 is closed to stabilize the high impedance node at Vvg. Then, the bypass switch 713 is opened and there will be a finite integration time across the capacitor 711. This integration time can be made proportionate to the value of a programmable resistor used in the memory elements. For example, a resistor value can be selected that has a nominal resistor value representative of the variety of resistor values that can appear in the programmable resistors within the array. That is, if the programmable resistors within the array can have values between 20 k and 500 k, then a nominal resistor value (e.g., 50 k) can be selected based on simulations and measurements to minimize the impact of the TCs of the resistors used in the array. It should be noted that this integration time will also determine the magnitude of the output signal from the subtractor and will compensate for the temp-coefficient. Furthermore, due to the switched capacitor circuit configuration, the value of the output can be held for some duration of time (e.g., trackand-hold device), the capacitor 711 can reference some other bias potential, and the power for the op-amp can be turned off to save power.

The subtractor circuits described above and illustrated in FIGS. 7A-7B are provided for illustration purposes and are not intended to be limiting. Alternatively, any other suitable subtractor circuit could be incorporated into the structure 200 as a data sensing element.

As mentioned above, FIGS. 1 and 2 are schematic diagrams illustrating embodiments of a structure 100, 200 including a partitioned memory architecture configured for in-memory pipeline processing (e.g., MAC processing). It should be understood that with in-memory pipeline processing, such as MAC processing, each processing layer (e.g., each MAC layer) will typically be handled by a discrete structure configured as described above (i.e., a discrete partitioned memory architecture) with the outputs from one structure for one MAC layer being fed, as inputs, to the next structure for the next MAC layer in the series. The number of inputs into a MAC Layer will be greater than the number of outputs from that MAC layer and, thus, the number of inputs to each MAC Layer in the series decreases until a final output is produced. It should be noted that in the absence of THs 170, 270, only serial processing can be performed in order to avoid processing errors. That is, processing of a sample through each structure to the final structure must be completed with the final structure generating a final solution before processing of another sample can begin. However, the presence of the THs 170, 270 in the initial memory banks of each discrete structure 100, 200 in the series enables pipeline processing to be performed. Specifically, because the analog voltage outputs from an upstream structure 100, 200 of the series-connected structures are sampled (as data input voltages) and stored (i.e., tracked and held) by THs 170, 270 in the initial memory banks of the adjacent downstream structure 100, 200 in the series, one the THs 170, 270 of the downstream structure are switched to the hold mode, the THs 170, 270 in the upstream structure 100, 200 can switch to the track mode to capture new inputs (i.e., another sample) while downstream processing of the earlier sample is being performed.

The presence of the THs 170, 270 in the initial memory banks of each discrete structure 100, 200 in the series, not only enables in-memory pipeline processing as described above, but also enables the in-memory pipeline processing to be interrupted or paused (e.g., periodically or on demand) so that calibration processing can be performed using the same sense circuitry (i.e., the same bitlines and sensing elements) used for in-memory pipeline processing. Specifically, as mentioned above, calibration processing refers to a process whereby an actual resistance value of a specific programmable resistor is determined. This actual resistance value can be compared to a desired/expected resistance value to determine whether or not reprogramming of the specific programmable resistor should be performed. During the calibration mode in the structures 100-200 of FIGS. 1-2 (i.e., when the THs 170, 270 are connected by the MUXs 118, 218 to the amplifiers 115, 215 in response to specific control bits 113, 213), only one specific programmable resistor in the array is selectable at a time for calibration processing or, alternatively, specific programmable resistors in different columns but at the same row address (i.e., in a memory bank within the same row and at the same particular row address within that memory bank) are concurrently selectable for the calibration processing. This is to ensure that the column-specific analog voltage and the column-specific digital value output from the data sensing element and ADC of any specific column is indicative of the resistance state (i.e., the actual resistance) of only one specific programmable resistor.

More specifically, during the calibration mode in the structures 100-200 of FIGS. 1-2 (i.e., when the calibration supply line 175, 275 is connected by the MUXs 118, 218 to the amplifiers 115, 215 in response to specific control bits 113, 213), the input nodes 119, 219 receive a calibration input voltage (Vcal) from the calibration supply line 175, 275. Vcal can be set at some predetermined fixed voltage level that it sufficiently high so that a current output from the specific programmable resistor can be sensed, but sufficiently low to prevent any reprogramming. For example, in some embodiments, Vcal can range between 0.15V and 0.3V (e.g., 0.2V). The control bits 113, 213 for the amplifiers 115, 215 in the structure 100, 200 can be set so that only one specific amplifier 115, 215 in the structure 100, 200 is in an on-state. The specific amplifier in the on-state can be in the initial memory bank of one specific row of memory banks at a particular address. This specific amplifier 115, 215 can generate and output a level shifted calibration voltage, which is essentially equal to the sum of Vcal plus Vvg. That is, it can add Vvg to Vcal to generate the level shifted calibration voltage. This level shifted calibration voltage can be received at the input terminals of the programmable resistors of all memory elements at the same particular address within the same row of memory banks. The control bits 113, 213 for all other amplifiers 115, 215 in the structure 100, 200 can be set so that the amplifiers output a high impedance (HiZ) state. Additionally, during the calibration mode, each specific bitline connected to each specific programmable resistor to be calibrated can bias be biased to Vvg (e.g., by the feedback buffer circuit 120, 220.1 or 220.2 connected to the specific bitline). All other feedback buffer circuits on all other bitlines are turned off. It should be noted that in the structure 200 of FIG. 2 only one programmable resistor of one dual resistor memory element at the particular address in a given memory bank within the specific row of memory banks can be calibrated at a time so the feedback buffer circuit on at least one of the two bitlines in any given memory bank will always be turned off during calibration processing.

As a result, for any given column during the calibration mode, the output current from only one specific programmable resistor is output at the output node of one specific memory bank in the column and received by the data sensing element 185, 285 for that column (via a column interconnect line). In the structure 100 of FIG. 1, the data sensing element 185 (i.e., the current-to-voltage converter) for the column can convert that output current to a column-specific analog output voltage 189, which during calibration processing, is indicative of the actual resistance value of the specific programmable resistor. In the structure 200 of FIG. 2, the data sensing element 285 (i.e., the subtractor) for the column can compare the output current from the one specific programmable resistor on the column interconnect line to the current on the other column interconnect line of a pair for the column (which is at 0 amps because all output nodes of all memory banks connected to that column interconnect line are also connected to feedback buffer circuits in the off state) and can output a column-specific analog output voltage 289, which during calibration processing is indicative of the actual resistance value of the specific programmable resistor. During calibration processing, the column-specific analog output voltage 189, 289 can, in turn, be converted to a column-specific digital value 188, 288 by the ADC 187, 287 for the column. The column-specific digital value can, for example, be compared to an expected digital value for the specific programmable resistor. If the values differ, a reprogramming processing can be performed (e.g., either immediately or in some subsequent time window designated for reprogramming).

FIG. 8 is an example of a timing diagram for performing in-memory pipeline processing (e.g., MAC processing including a series of MAC layers) with interspersed calibration processing. As mentioned above, such processing will require multiple instances of the structure 100, 200 described above (one for each MAC layer). In-memory pipeline processing begins with the input MAC layer (Layer 1) structure processing a first sample captured and stored by the THs (Sample 1). Time 1, Sample 1 data input voltages are input into the Layer 1 structure (i.e., all activation voltages of Sample 1 are sampled and hold by THs of the Layer 1 structure). Time 2, within the Layer 1 structure, the data input voltages of Sample 1 are level-shifted by Vvg and the bitlines are biased to Vvg (i.e., allow settling time for the Vvg buffer). Time 3, within the Layer 1 structure, the data sensing elements (i.e., current-to-voltage converters or subtractors, as applicable) are activated. Time 4, the column-specific output voltages generated by the data sensing elements of the Layer 1 structure are fed to the THs of the Layer 2 structure. These above-described processes can be repeated in the Layer 2 structure. However, optionally, before processing begins withing the Layer 2 structure, calibration processing can be performed within the Layer 1 structure.

That is, at Times 4A-4D, in the Layer 1 structure, calibration processing occurs. That is, the MUXs switch the inputs to Vcal, the amplifiers receive the appropriate control bits, in a specific amplifier Vcal is level-shifted by Vvg, specific bitlines are biased (as discussed above to Vvg or GND as appropriate), and, for each column containing a specific programmable resistor being calibrated, the data sensing element for that column is activated in order to acquire the analog voltage and digital value indicative of the resistance state of the specific programmable resistor. Once this calibration process is complete, in-memory pipeline processing can continue. It should be noted that at Times 4A-4D, the analog voltages previously capture by the THs of the Layer 2 structure from the data sensing elements of the Layer 1 structure are held but not processed.

Then, at Time 5 processing in the Layer 2 structure is again initiated. The amplifiers in the Layer 2 structure level-shift the previously received analog voltages from the Layer 1 structure by Vvg and the bitlines are biased to Vvg (i.e., allow settling time for the Vvg buffer). Time 6, within the Layer 2 structure, the current-to-voltage converters or subtractors are activated. Time 7, the column-specific output voltages generated by the current-to-voltage converters or subtractors of the Layer 2 structure are fed to the THs of a Layer 3 structure, which processes another hidden MAC layer. These above-described processes are repeated in the Layer 3 structure. That is, Time 7, within the Layer 3 structure, the column-specific output voltages from the Layer 2 structure are sampled and held by THs as data input voltages. Time 8, within the Layer 3 structure, the data input voltages are level-shifted by Vvg and the bitlines are biased to Vvg (i.e., allow settling time for the Vvg buffer). Time 9, within the Layer 3 structure, the current-to-voltage converters or subtractors are activated. Time 10, the column-specific output voltages generated by the current-to-voltage converters or subtractors of the Layer 3 structure are fed to the THs of a Layer 4 structure. Layer structure-to-Layer structure processing continues as described above until the final solution for Sample 1 is output by the final Layer structure in the series.

Furthermore, at Time 4D, Layer 1 can also initiate processing of Sample 2. That is, at Time 4D, the THs of the Layer 1 structure can sample and hold the activation voltages of Sample 2. Time 5, within the Layer 1 structure, the data input voltages of Sample 2 are level-shifted by Vvg and the bitlines are biased to Vvg (i.e., allow settling time for the Vvg buffer). Time 6, within the Layer 1 structure, the current-to-voltage converters or subtractors, as applicable, are activated. Time 7, the column-specific output voltages generated by current-to-voltage converters or subtractors of the Layer 1 structure are fed to the THs of the Layer 2 structure, which processes a hidden MAC layer. These above-described processes are repeated in the Layer 2 structure, and then again in Layer 3, and so on. Thus, during Time 4D-Time7, processing is being performed by the Layer 1 structure on Sample 2 and, concurrently, downstream processing is being performed by the Layer 2 structure on Sample 1, and so on.

FIG. 8 only shows MAC processing including three MAC layers with a pause in all MAC processing to perform calibration processing within the Layer 1 structure occurring after processing of Sample 1 in Layer 1 and before processing of Sample 2 in Layer 1. However, it should be understood that FIG. 8 is not intended to be limiting and that such MAC processing typically requires significantly more layers to develop a final solution and pauses for calibration processing can be performed within any Layer because the THs enable storage of inputs.

Figure 9A:
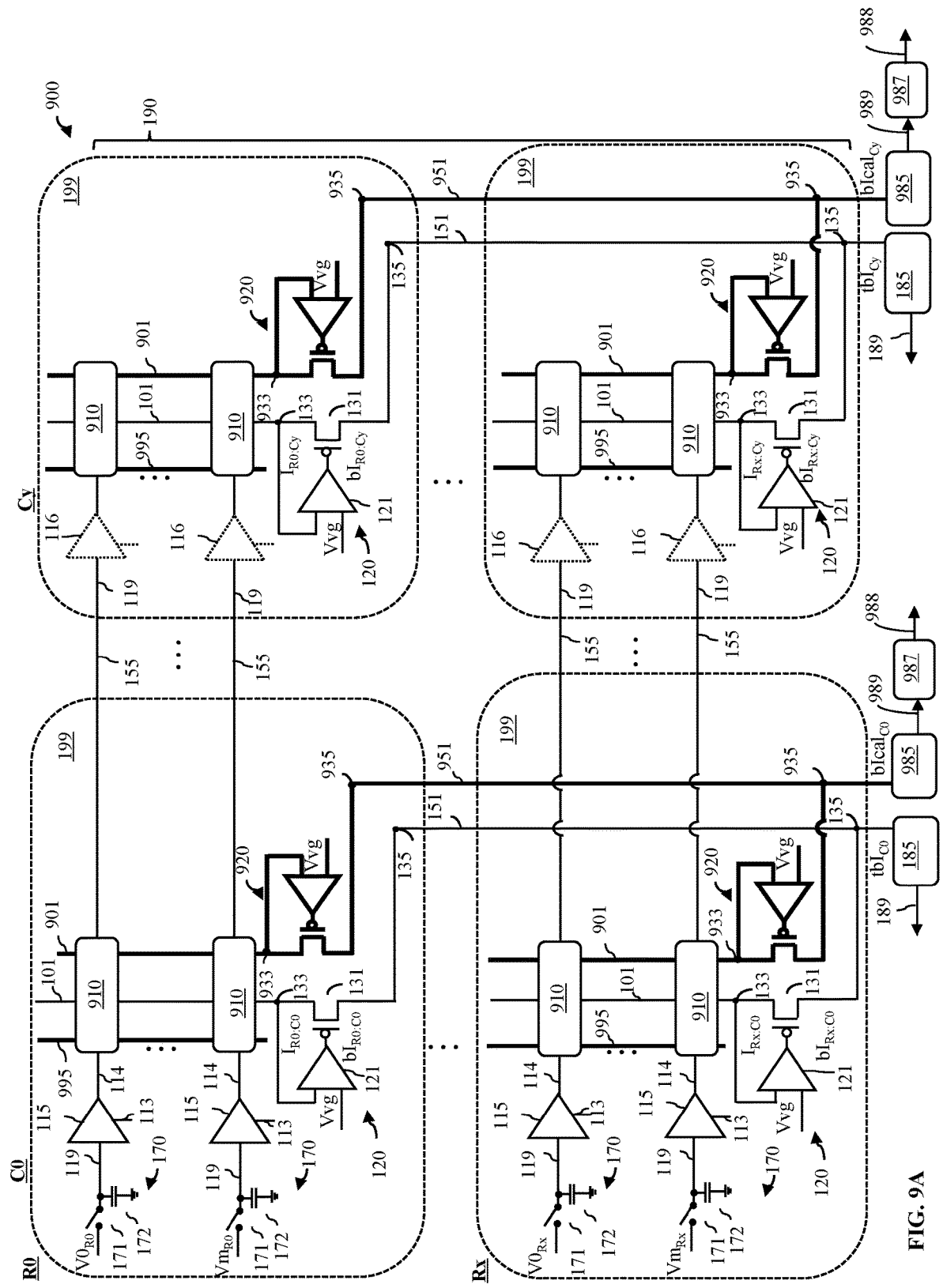
FIG. 9A is a schematic diagram illustrating a disclosed structure for in-memory pipeline processing with concurrent calibration processing.
Figures 1, 9B:
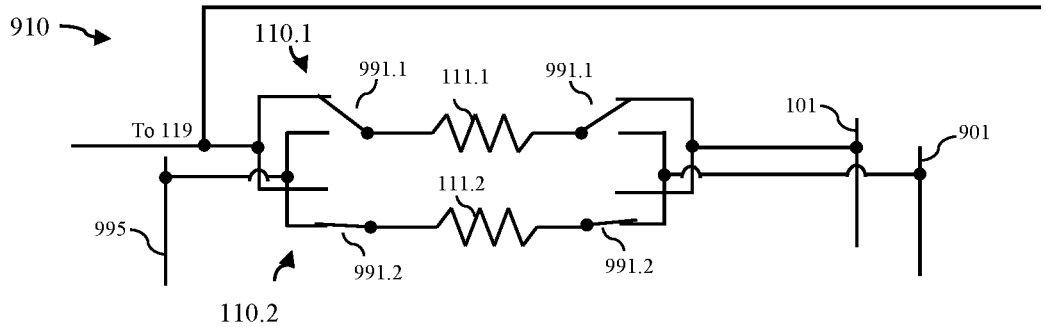
Figures 2, 9B:
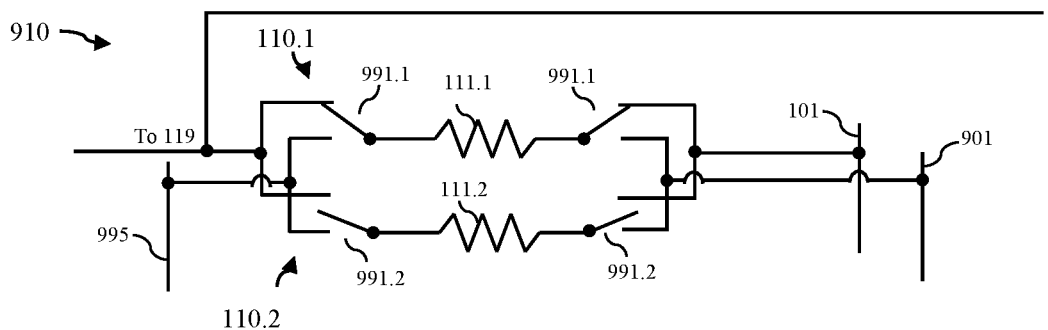
Figures 3, 9B:
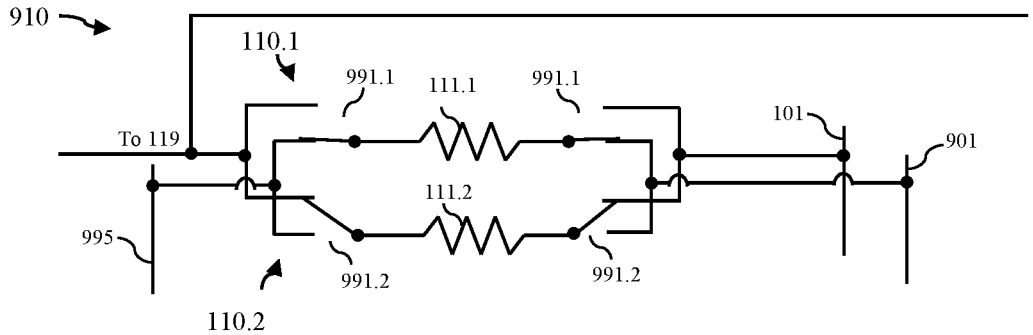
Figure 10A:
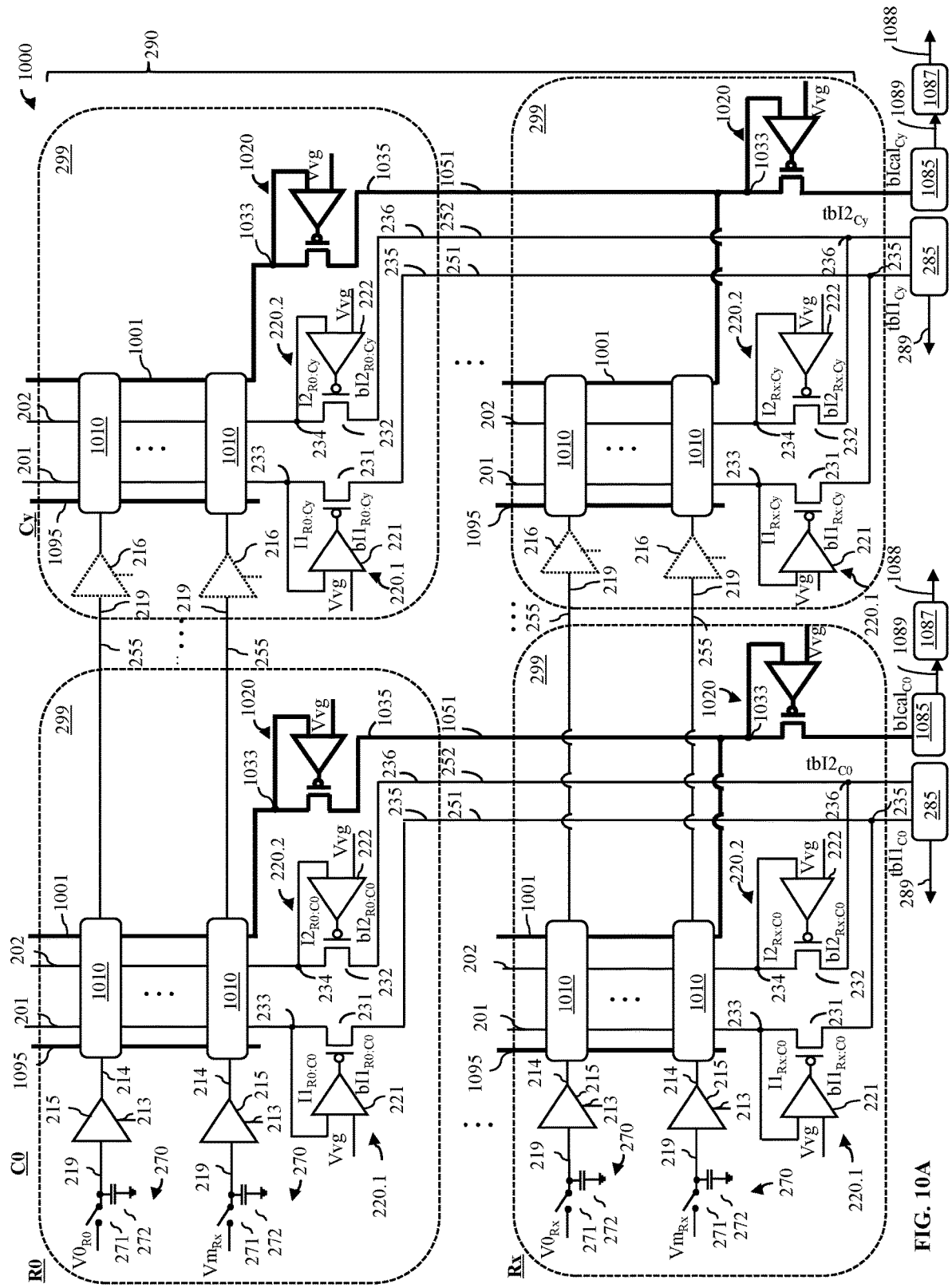
FIG. 10A is a schematic diagram illustrating another disclosed structure for in-memory pipeline processing with concurrent calibration processing.

FIG. 9A is a schematic diagram illustrating a structure 900 including the structure 100 of FIG. 1 modified with additional circuitry to enable concurrent in-memory pipeline processing (e.g., MAC processing) and calibration processing. Similarly, FIG. 10A is a schematic diagram illustrating a structure 1000 including the structure 200 of FIG. 2 modified with additional circuitry to enable concurrent in-memory pipeline processing (e.g., MAC processing) and calibration processing. Specifically, instead of including single resistor memory elements 110 or dual resistor memory elements 210 at each address in the array, the structure 900 of FIG. 9A includes a duplicate pair 910 of single resistor memory elements (e.g., see FIG. 9B and the detailed discussion below) and the structure 1000 of FIG. 10A includes a duplicate pair 1010 of dual resistor memory elements (see FIG. 10B and the detailed discussion below). Additionally, instead of including a MUX 118, 218 that selectively connects the inputs of the amplifiers in the initial memory banks to Vcal during a calibration process and using the same sense bitlines and data sensing elements for calibration, the structure 900 of FIG. 9A and the structure 1000 of FIG. 10A include both operational circuitry for in-memory pipeline processing and calibration circuitry (e.g., calibration supply lines and calibration sense lines for each memory bank and calibration interconnect lines, calibration sensing elements, etc. or each column of memory banks) for calibration processing. In these structures 900, 1000, switches connected to opposing end terminals of the programmable resistors of the memory elements of each duplicate pair enable one memory element of the duplicate pair to be connected to the operational circuitry for in-memory pipeline processing and further enable the programmable resistor(s) of the other memory element of the duplicate pair to be individually and selectively connected to the calibration circuitry for on-demand calibration processing or disconnected from both the operational circuitry and the calibration circuitry.

More particularly, the structure 900 of FIG. 9A is a modification of the structure 100 of FIG. 1 with additional features labeled in the 900's (e.g., 900, 901, etc.). Similarly, the structure 1000 of FIG. 10A is a modification of the structure 200 of FIG. 2. As illustrated, the structure 900, 1000 can include an array 190, 290 of memory banks 199, 299. Each memory bank 199, 299 in structure 900, 1000 can further include operational circuitry and, more particularly, essentially the same circuitry included in the memory banks 199, 299 of the structure 100, 200 discussed above.

Specifically, in the structure 900, this operational circuitry includes but is not limited to: in each initial memory bank of each row of memory banks, THs 170 and amplifiers 115; optional voltage buffers 116 in one or more downstream memory banks in any row of memory banks 199; and, in each memory bank, a bitline 101 and a feedback buffer circuit 120 connected to both a bias node 133 on the bitline 101 and to an output node 135. Like the structure 100, the structure 900 also includes sets of row interconnect lines 155 that interconnect adjacent memory banks in each row of memory banks, column interconnect lines 151 connected to the output nodes 135 of each memory bank 199 in the same column, and a data sensing element 185 (e.g., a current-to-voltage converter) for each column connected to the column interconnect line 151 for that column.

In the structure 1000, this operational circuitry includes but is not limited to: in each initial memory bank of each row of memory banks, THs 270 and amplifiers 215; optional voltage buffers 216 in one or more downstream memory banks in any row of memory banks 299; and, in each memory bank, a first bitline 201, a second bitline 202, a first feedback buffer circuit 220.1 connected to both a first bias node 233 on the first bitline 201 and a first output node 235, and a second feedback buffer circuit 220.2 connected to both a second bias node 234 on the second bitline 202 and a second output node 236.

Like the structure 100, the structure 900 also includes sets of row interconnect lines 155 that interconnect adjacent memory banks in each row of memory banks, column interconnect lines 151 connected to the output nodes 135 of each memory bank 199 in the same column, and a data sensing element 185 (e.g., a current-to-voltage converter) for each column connected to the column interconnect line 151 for that column. Like the structure 200, the structure 1000 also includes the sets of row interconnect lines 255 that interconnect adjacent memory banks in each row of memory banks, first column interconnect lines 251 connected to the first output nodes 235 of each memory bank 299 in the same column, second column interconnect lines 252 connected to the second output nodes 236 of each memory bank 299 in the same column, and a data sensing element 285 (e.g., a subtractor) for each column connected to the first and second column interconnect lines 251 and 252 for that column.

Each memory bank 199, 299 in the structure 900, 1000 can further include calibration circuitry. The calibration circuitry can include a calibration supply line 995, 1095 for supplying a level shifted calibration input voltage to the memory bank 199, 299. This level shifted calibration input voltage can be set at a predetermined voltage level that is essentially equal to the sum of a calibration input voltage (Vcal) plus Vvg. Vcal can be set at some predetermined fixed voltage level that is sufficiently high so that a current output from the specific programmable resistor can be sensed, but sufficiently low to prevent any reprogramming.

For example, in some embodiments, Vcal can range between 0.15V and 0.3V (e.g., 0.2V). The calibration circuitry can further include: a calibration output node 935, 1035; a calibration sense line 901, 1001 including a calibration bias node 933, 1033 at one end; and a calibration feedback buffer circuit 920, 1020 connected to the calibration bias node 933, 1033 and the calibration output node 935, 1035. It should be noted that the calibration feedback buffer circuit 920, 1020 can be configured essentially the same as the feedback buffer circuit 120, 220.1-220.2, described above, for biasing the calibration bias node 933, 1033 to Vvg during calibration processing.

The structure 900, 1000 can also include additional calibration circuitry. The additional calibration circuitry can include, for example, calibration interconnect lines 951, 1051 for the columns with each calibration interconnect line for a column connected to the calibration output nodes 935, 1035 of all memory banks 199, 299 in that column, calibration sensing elements 985, 1085 (e.g., current-to-voltage converters) for the columns with each calibration sensing element for a column connected to the calibration interconnect line 951, 1051 for that column, and analog-to-digital converters (ADC) 987, 1087 for the columns with each ADC for a column connected to the calibration sensing element 985,1085 for that column.

Figure 11:
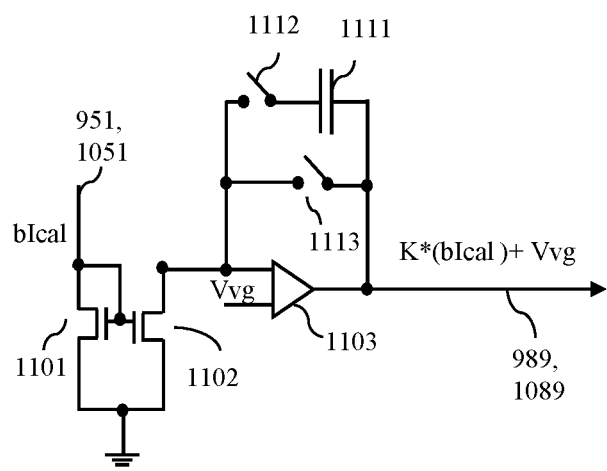
FIG. 11 is a schematic diagram illustrative of a calibration current-to-voltage converter that can be incorporated into the structures of FIGS. 9A and 10A for calibration processing.

The calibration sensing elements 985, 1085 can have a similar configuration to that of the data sensing elements 185, 285. For example, FIG. 11 is a schematic diagram illustrating a current-to-voltage converter that can be used in the structure 900 for the calibration sensing elements 985 if/when the data sensing elements 185 are configured in essentially the same manner as the current-to-voltage converter shown in FIG. 6D. This same current-to-voltage converter can be used in the structure 1000 for the calibration sensing elements 1085 if/when the data sensing elements 285 are configured in essentially the same manner as the subtractor shown in FIG. 7B. The current-to-voltage converter of FIG. 11 includes a first stage and a second stage. The first stage includes first and second NFETs 1101-1102 and the second stage includes an amplifier 1103 and a feedback switched capacitor circuit. The first NFET 1101 is connected in series between the calibration interconnect line 951, 1051 and GND. The second NFET 1102 is connected in series between a first input to the amplifier 1103 and GND. The drain node of the first NFET 1101 can control the gates of the first and second NFETs 1101-1102. In the second stage, the amplifier 1103 also has a second input connected to receive Vvg and an output. The feedback switched capacitor circuit includes a capacitor 1111 that is connected to the output of the amplifier 1103 and further connected by a first switch 1112 to the first input of the amplifier 1103. The feedback switched capacitor circuit can also include a bypass switch 1113 that connects the output to the first input of the amplifier 1103, bypassing the capacitor 1111. In operation, initially the bypass switch 1113 is closed to stabilize the high impedance node at Vvg. Then, the bypass switch 1113 is opened and there will be a finite integration time across the capacitor 1111. This integration time can be made to be proportionate to the value of a programmable resistor used in the memory elements. For example, a resistor value can be selected that has a nominal resistor value representative of the variety of resistor values that can appear in the programmable resistors within the array. That is, if the programmable resistors within the array can have values between 20 k and 500 k, then a nominal resistor value (e.g., 50 k) can be selected based on simulations and measurements to minimize the impact of the TCs of the resistors used in the array. It should be noted that this integration time will also determine the magnitude of the output signal from the converter and will compensated for the temp-coefficient. Furthermore, due to the switched capacitor circuit configuration, the value of the output can be held for some duration of time (e.g., track-and-hold circuit), the capacitor 1111 can reference some other bias potential, and the power for the op-amp can be turned off to save power. Alternatively, any other suitable current-to-voltage converter circuit could be incorporated into the structure 900, 1000 as a calibration sensing element.

Figures 4, 9B:
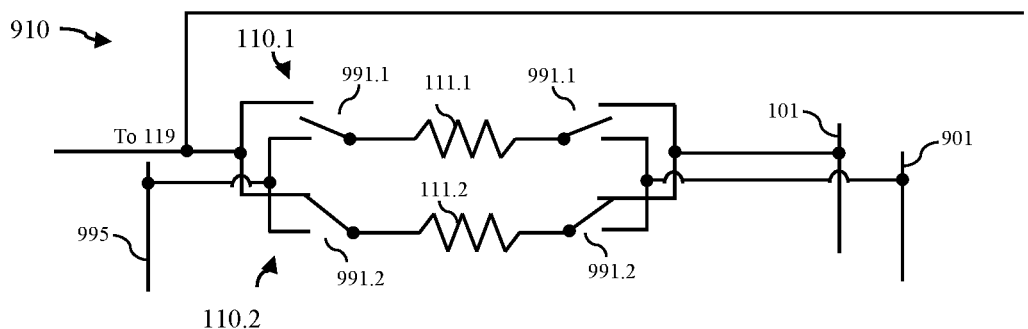
Figures 1, 10B:
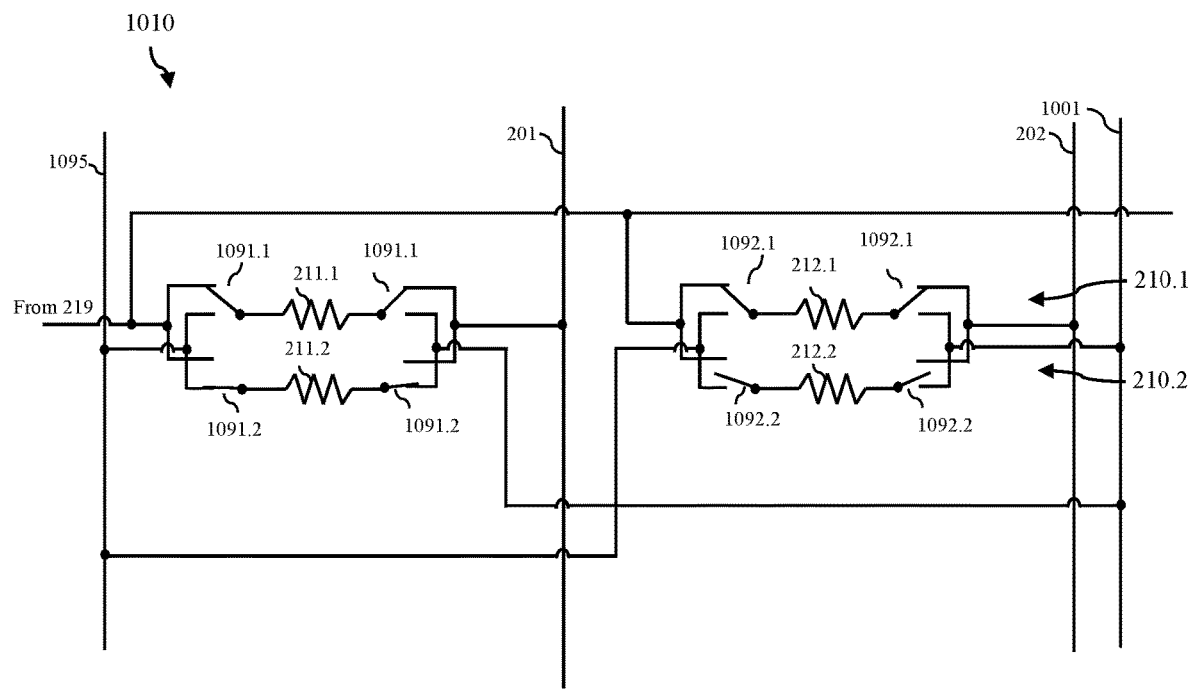
Figures 2, 10B:
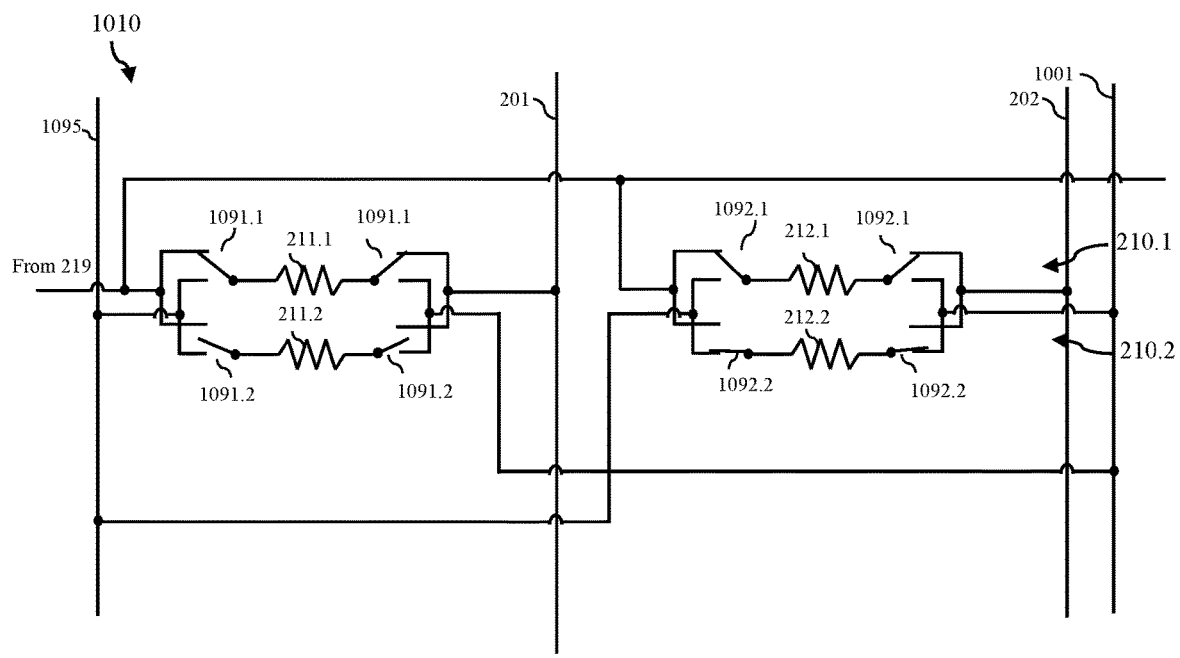
Figures 3, 10B:
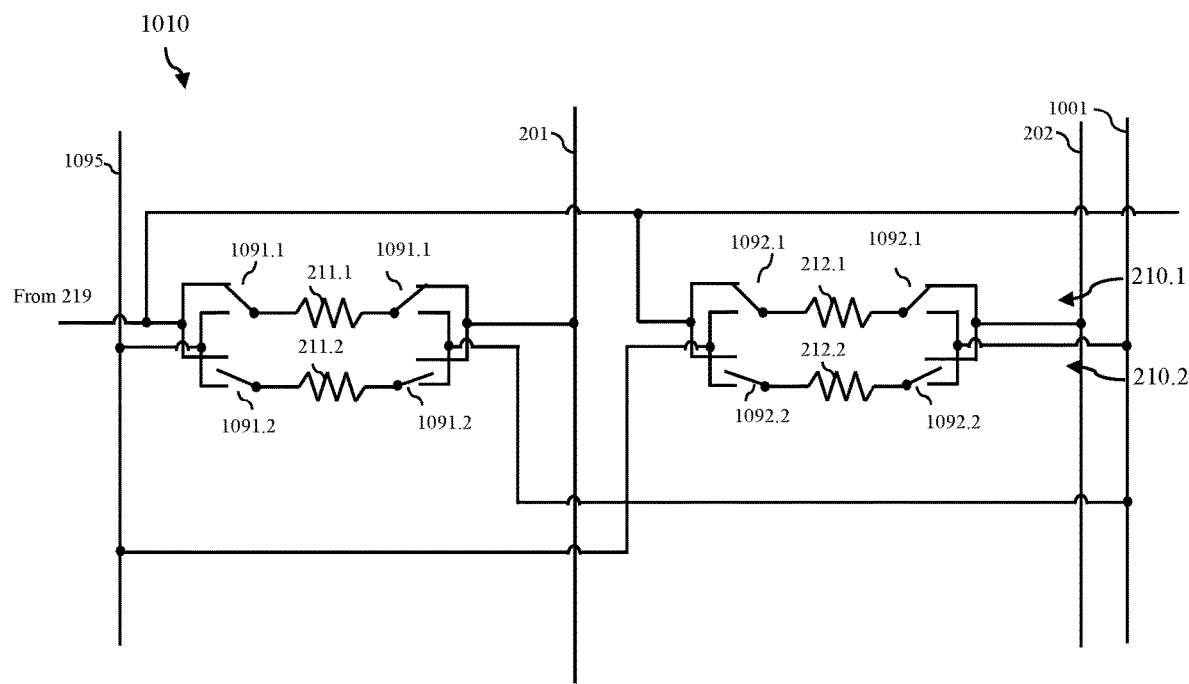
Figures 4, 10B:
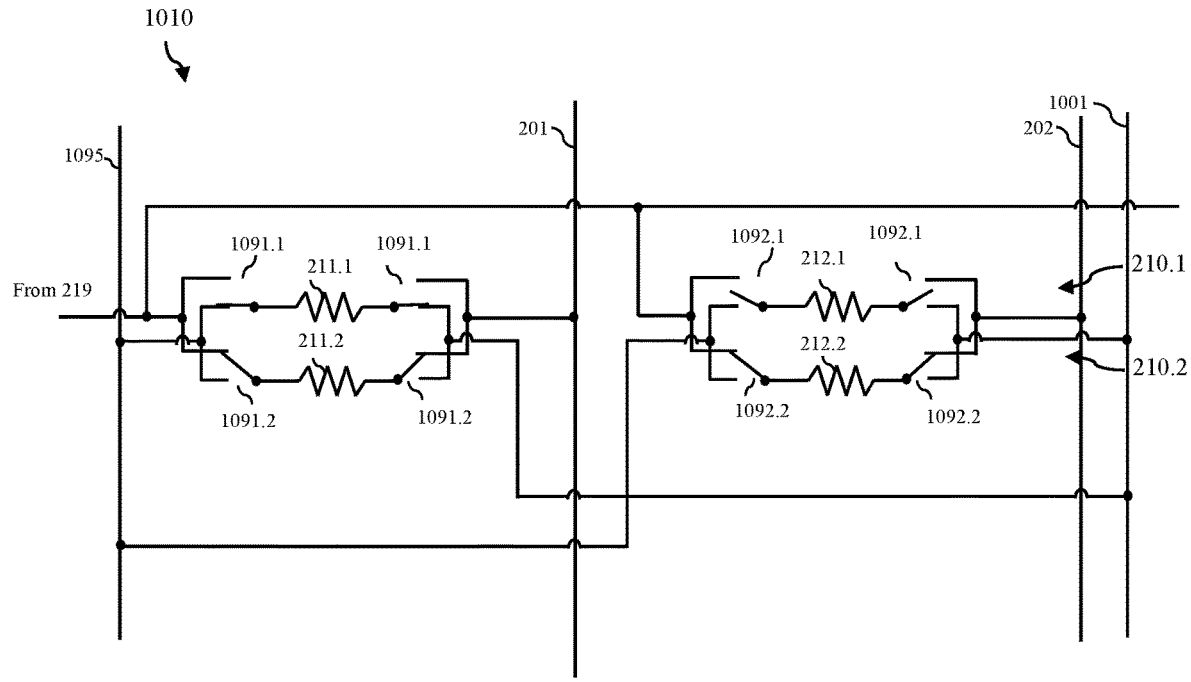
Figures 5, 10B:
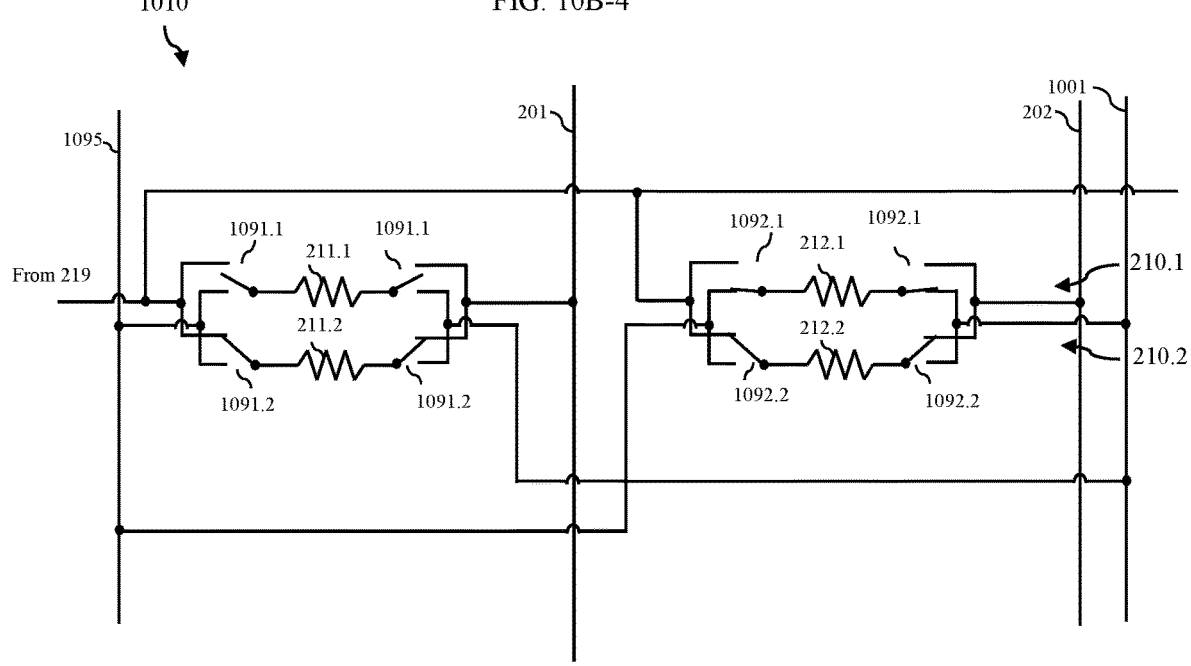
Figures 6, 10B:
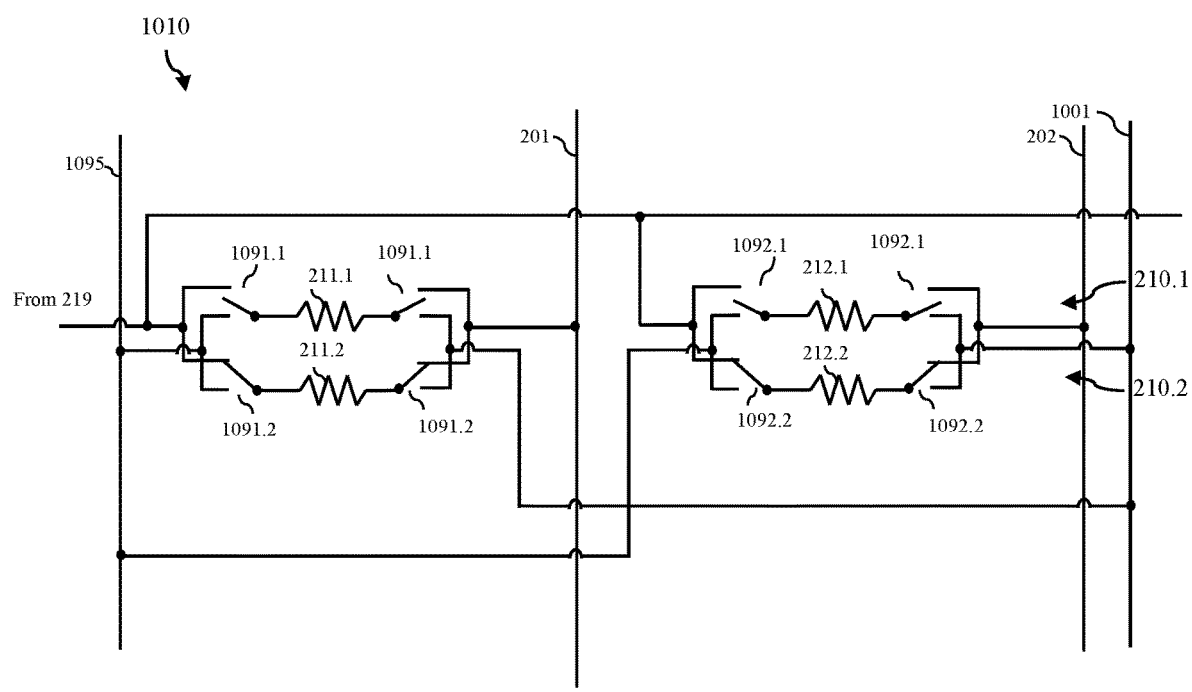

Each memory bank 199, 299 in the structure 900, 1000 can further include duplicate pairs 910, 1010 of memory elements 110.1-110.2, 210.1-210.2 (as opposed to memory elements 110, 210). That is, in the structure 900, each memory bank 199 can include duplicate pairs 910 of single resistor memory elements 110.1-110.2. FIG. 9B is a schematic diagram illustrating a duplicate pair 910. As illustrated in FIGS. 9B-1 to 9B-4, the single resistor memory element 110.1 and 110.2 can be single programmable resistors 111.1 and 111.2, respectively. Each duplicate pair 910 of single resistor memory elements 110.1-110.2 can also include switches at the opposing end terminals of the programmable resistors therein (e.g., see the switches 991.1 at the opposing end terminals of the programmable resistor 111.1 and the switches 991.2 at the opposing end terminals of the programmable resistor 111.2). In the structure 1000, each memory bank 299 can include duplicate pairs 1010 of dual resistor memory elements 210.1-201.2. FIG. 10B is a schematic diagram illustrating a duplicate pair 1010 of dual resistor memory elements 210.1-210.2. As illustrated in FIGS. 10B-1 to 10B-6, each dual resistor memory element 210.1 and 210.2 can be include a first programmable resistor 211.1, 211.2 and a second programmable resistor 212.1, 212.2. Each duplicate pair 1010 of dual resistor memory elements 210.1-210.2 can also include switches at the opposing end terminals of each of the programmable resistors therein (e.g., in the dual resistor memory element 210.1, see the switches 1091.1 at the opposing end terminals of the first programmable resistor 211.1 and the switches 1092.1 at the opposing end terminals of the second programmable resistor 212.1; in the dual resistor memory element 210.2, see the switches 1091.2 at the opposing end terminals of the first programmable resistor 211.2 and the switches 1092.2 at the opposing end terminals of the second programmable resistor 212.2).

These switches can include, for example, 3-to-1 multiplexors (3:1 MUXs) at the input terminals of each programmable resistor to allow for selective connection of an operational input node to the input terminal, a calibration supply line to the input terminal, or no operational or calibration circuit component to the input terminal. The switches can also include, for example, 1-to-3 multiplexors (1:3 MUXs) at the output terminals of each programmable resistor to allow for selective connection of the output terminal to an operational bitline, to a calibration sense line, or to no operational or calibration circuit component.

More specifically, the switches 991.1 at the opposing end terminals of the programmable resistor 111.1 and the switches 991.2 at the opposing end terminals of the programmable resistor 111.2 in the duplicate pair 910 can be controllable so the programmable resistors 111.1 and 111.2 are each connectable to the operational circuitry (e.g., an operational input node and a bitline), connectable to the calibration circuitry (i.e., a calibration supply line and a calibration sense line), and disconnectable from both the operational circuitry and the calibration circuitry. For example, the switches 991.1-991.2 can be controlled so as to selectively connect one programmable resistor of one single resistor memory element of a duplicate pair 910 to the operational circuitry for in-memory pipeline processing and so as to either connect the programmable resistor of the other single resistor memory element of the duplicate pair to the calibration circuitry for calibration processing or disconnect it from both the operational circuitry and the calibration circuitry (e.g., when no calibration processing is being performed or when calibration processing is directed to a different programmable resistor in the same column). FIGS. 9B-1 to 9B-4 show various alternative states of the switches 991.1-991.2.

Similarly, the switches 1091.1 at the opposing end terminals of the first programmable resistor 211.1, the switches 1092.1 at the opposing end terminals of the second programmable resistor 212.1, the switches 1091.2 at the opposing end terminals of the first programmable resistor 211.2, and the switches 1092.2 at the opposing end terminals of the second programmable resistor 212.2 in the duplicate pair 1010 are controllable so that the programmable resistors 211.1, 211.2, 212.1, 212.2 are each connectable to the operational circuitry (i.e., an operational input node and a first bitline and the operational input node and a second bitline), connectable to the calibration circuitry (i.e., a calibration supply line and a calibration sense line), and disconnectable from both the operational circuitry and the calibration circuitry. Thus, for example, the switches 1091.1-1091.2 1092.1-1092.2 can be controlled so as to selectively connect the two programmable resistors of one dual resistor memory element of a duplicate pair 1010 to the operational circuitry for in-memory pipeline processing. In this case, the switches 1091.1-1091.2 1092.1-1092.2 can further be controlled to connect one programmable resistor of the other dual resistor memory element of the duplicate pair to the calibration circuitry for calibration processing and to disconnect the other from the operational circuitry and the calibration circuit. Alternatively, the switches can further be controlled to disconnect both programmable resistors of the other dual resistor memory element of the duplicate pair from both the operational circuitry and the calibration circuitry (e.g., when no calibration processing is being performed or when calibration processing is directed to a different programmable resistor in the same column). FIGS. 10B-1 to 10B-6 show various alternative states of the switches 1091.1-1091.2 and 1092.1-1092.2.

In the structure 900, 1000, the duplicate pairs 910, 1010 of memory elements and the switches in each of these structures 900, 1000 configured as described above facilitate concurrent performance of both in-memory pipeline processing (e.g., MAC processing) and calibration processing.

More particularly, multiple instances of the structure 900, 1000 could be employed for in-memory pipeline processing. As discussed above, with in-memory pipeline processing, such as MAC processing, each processing layer (e.g., each MAC layer) will typically be handled by a discrete structure configured as described above (i.e., a discrete partitioned memory architecture) with the outputs from one structure for one MAC layer being fed, as inputs, to the next structure for the next MAC layer in the series. The number of inputs into a MAC Layer will be greater than the number of outputs from that MAC layer and, thus, the number of inputs to each MAC Layer in the series decreases until a final output is produced. The presence of the THs 170, 270 in the initial memory banks enables pipeline processing to be performed.

During in-memory pipeline processing using the structure 900, 1000, the switches in each duplicate pair 910, 1010 of memory elements can be controlled so that one memory element 110.1 or 110.2, 210.1 or 210.2 of each duplicate pair 910, 1010 of memory elements in each memory bank within the array 190, 290 will be connected to the operational circuitry at all times allowing in-memory pipeline processing to proceed essentially as described above with regard to the structure 100 of FIG. 1 or 200 of FIG. 2. During in-memory pipeline processing using the structure 900, 1000, the switches in each duplicate pair 910, 1010 of memory elements can further be controlled so that the other memory element of each duplicate pair is disconnected from both the calibration circuitry and the operational circuitry and, thus, idle such that at times only in-memory pipeline processing is performed within the structure. However, optionally, at other times calibration processing can be performed concurrently with in-memory pipeline processing. That is, while in-memory pipeline processing is being performed using the structure, calibration processing can also be directed to a single programmable resistor within the structure (i.e., to one specific programmable resistor of one specific memory element of one specific duplicate pair in a specific memory bank of a specific column within the structure) or to a sing programmable transistor within each of one or more columns of the structure (i.e., to one specific programmable resistor of one specific memory element of one specific duplicate pair in one or more columns).

Thus, for example, in the structure 900 concurrent calibration processing can be directed to one specific programmable resistor 111.1 or 111.2 of one specific single resistor memory element 110.1 or 110.2 of one specific duplicate pair 910 in a specific memory bank of one specific column, while the other programmable resistor of the other single resistor memory element of the specific duplicate pair is employed for in-memory pipeline processing. To accomplish this, the switches are controlled to selectively connect the opposing end terminals of the specific programmable resistor to the calibration supply line 995 and the calibration sense line 901 for the specific memory bank. The calibration supply line 995 supplies the level shifted calibration input voltage to the input terminal of the specific programmable resistor and the calibration feedback buffer circuit 920 for the specific memory bank biases the calibration bias node 933 on the calibration sense line 901 for the specific memory bank to Vvg. It should be noted that during calibration processing directed to this specific programmable resistor no other programmable resistor in the same specific memory bank or in the same column of memory banks will be connected to calibration circuitry and the calibration feedback buffer circuits 920 in all other memory banks in the same column of memory banks will be in off states. Thus, the only current on the calibration interconnect line 951 is the buffered current from the specific memory bank (which was generated due to the application of the level shifted calibration voltage to the input terminal of the specific programmable resistor).

Similarly, in the structure 1000 concurrent calibration processing can be directed to one specific programmable resistor of the two programmable resistors of one specific dual resistor memory element 210.1 or 210.2 of one specific duplicate pair 1010 in a specific memory bank of one specific column of memory banks, while the other programmable resistor of the specific dual resistor element of the specific duplicate pair is disconnected from both the operational circuitry and the calibration circuit and while the other dual resistor memory element of the specific duplicate pair is employed for in-memory pipeline processing. To accomplish this, the switches are controlled to selectively connect the opposing end terminals of the specific programmable resistor to the calibration supply line 1095 and the calibration sense line 1001 for the specific memory bank and to disconnect the other programmable resistor of the specific dual resistor memory element from both the operational circuitry and the calibration circuitry. The calibration supply line 1095 supplies the level shifted calibration input voltage to the input terminal of the specific programmable resistor and the calibration feedback buffer circuit 1020 for the specific memory bank biases the calibration bias node 1033 on the calibration sense line 1001 for the specific memory bank to Vvg. It should be noted that during calibration processing directed to this specific programmable resistor no other programmable resistor in the same specific memory bank or in the same column of memory banks will be connected to calibration circuitry and the calibration feedback buffer circuits in all other memory banks in the same column of memory banks will be in off states. Thus, the only current on the calibration interconnect line 1051 is the buffered current from the specific memory bank (which was generated due to the application of the level shifted calibration voltage to the input terminal of the specific programmable resistor).

Additionally, during this calibration processing in both the structure 900 and the structure 1000, the current on the calibration interconnect line 951, 1051 for the specific column (i.e., the column-specific calibration output current) is sensed by the calibration sensing element 985, 1085 (e.g., a current-to-voltage converter, as discussed above and illustrated in FIG. 11). The calibration sensing element 985, 1085 can convert the column-specific calibration output current to a column-specific calibration output voltage 989, 1089. The column-specific calibration output voltage 989, 1089 can, in turn, be converted to a column-specific digital value 988, 1088 by the ADC 987, 1087 for the specific column. The column-specific digital value 988, 1088 can, for example, be compared to an expected digital value for the specific programmable resistor. If the values differ, a reprogramming processing can be performed (e.g., either immediately or in some subsequent time window designated for reprogramming).

It should be noted that, while only one programmable resistor in the specific column can be calibrated at any given time, calibration processing can be concurrently performed in multiple different columns. For example, one programmable resistor in each column of memory banks can be concurrently calibrated.

FIG. 12 is an example of a timing diagram for concurrently performing in-memory pipeline processing and calibration processing using the structure 900 or 1000.

To perform in-memory processing, as described above, the structures disclosed herein (e.g., the structure 100 of FIG. 1, 200 of FIG. 2, 900 of FIGS. 9A to 9B-4 and 1000 of FIGS. 10A to 10B-6) can include additional control and connecting circuitry to both feed outputs from structure to the next and to concurrently perform calibration processing (including controlling operation of the switches that selectively connect or disconnect specific memory elements to the operational circuitry, the calibration circuitry, or neither). In general, control and connecting circuitry are known in the art and, thus, the details thereof have been omitted from this specification in order to allow the reader to focus on the salient aspects of the disclosed embodiments.

The structures disclosed herein (e.g., the structure 100 of FIG. 1, the structure 200 of FIG. 2, the structure 900 of FIGS. 9A to 9B-4 and the structure 1000 of FIGS. 10A to 10B-6) can also include additional circuitry (not shown) to implement other operational modes (e.g., program modes). Specifically, as mentioned above prior to operation of the structure 100, 200, 900, 1000 in the normal operational mode (i.e., in the mission mode during which in-memory processing is performed), the programmable resistors of the memory elements are programmed to particular resistance states and can further be reprogrammed, if necessary, following calibration processing. Depending upon the type of programmable resistors incorporated into the memory elements, different write schemes could be employed to achieve the desired programming/reprogramming (as discussed above with regard to FIGS. 3A-3D, 4A-4B and 5A-5B). Additional circuit components for such write schemes (e.g., for RRAM-type programmable resistors) have been disclosed by the inventors in other concurrently filed U.S. patent applications. However, to allow the reader to focus on the salient aspects of the disclosed embodiments specifically related to calibration processing and to avoid clutter in the figures, these additional circuit components have been omitted from this disclosure. In any case, it should be understood that in the structure embodiments disclosed herein the programmable resistors of the memory elements are individually programmable and reprogrammable to desired resistance states.

Additionally, in the structures disclosed herein the memory elements are described and shown in the figures as being either single resistor memory elements or dual resistor memory elements. However, it should be understood that the figures and description thereof are not intended to be limiting. Alternatively, the disclosed structures could include memory elements with more than two programmable resistors. In this case, each memory bank would have a corresponding number of bitlines with feedback buffer circuits and each column of memory banks would have additional circuitry (e.g., addition or subtraction circuitry) to combine the current outputs from all bitlines as appropriate depending upon whether the resistances states of the programmable resistors represent positive or negative weight values.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises", "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    an array of memory banks arranged in rows and columns, wherein each memory bank comprises:
        input nodes;
        at least one bitline;
        memory elements, wherein each memory element comprises at least one programmable resistor connected between a corresponding input node and the at least one bitline; and
        at least one feedback buffer circuit connected to the at least one bitline, and
    wherein each row of the memory banks in the array comprises an initial memory bank comprising:
        amplifiers connected in series between the input nodes and the memory elements, respectively;
        track-and-hold devices;
        a calibration supply line; and
        multiplexors, wherein each multiplexor has an output connected to an amplifier and at least a first input connected to a track-and-hold device and a second input connected to the calibration supply line.

2. The structure of claim 1, further comprising data sensing elements for the columns of the memory banks, respectively, wherein each data sensing element for each column is connected to at least one column interconnect line for the column and wherein each column interconnect line for the column is connected to one output node of each memory bank in the column.

3. The structure of claim 2, further comprising analog-to-digital converters connected to the data sensing elements, respectively, wherein each analog-to-digital converter for each column receives a column-specific analog voltage from the data sensing element for the column and converts the column-specific analog voltage to a column-specific digital value.

4. The structure of claim 2, wherein the multiplexors are controllable to any one of connect the track-and-hold devices to the input nodes for in-memory pipeline processing and connect the calibration supply line to the input nodes for calibration processing.

5. The structure of claim 4,
wherein each track-and-hold device comprises:
an analog voltage terminal;
a track node connected to an input node;
a switch connected between the analog voltage terminal and the track node; and
a capacitor connected between the track node and ground,
wherein each track-and-hold device is operable in one of a track mode and a hold mode,
wherein, in the track mode, the switch of each track-and-hold device connects the analog voltage terminal to the track node and the capacitor stores a stored voltage equal to an analog voltage at the analog voltage terminal and, in the hold mode, the switch disconnects the analog voltage terminal from the track node, and
wherein, during the in-memory pipeline processing, feedback buffer circuits connected to bitlines in the memory banks concurrently bias the bitlines to a virtual ground voltage and each amplifier in each initial memory bank receives, as a data input voltage, the stored voltage from a corresponding track-and-hold device, adds the virtual ground voltage to the data input voltage, and outputs a level shifted data input voltage equal to a sum of the data input voltage and the virtual ground voltage.

6. The structure of claim 4, wherein, during the calibration processing, a specific feedback buffer circuit connected to a specific bitline connected to a specific programmable resistor to be calibrated biases the specific bitline to a virtual ground voltage and a specific amplifier connected to a specific memory element comprising the specific programmable resistor receives a calibration input voltage from the calibration supply line, adds the virtual ground voltage to the calibration input voltage, and outputs a level shifted calibration voltage equal to a sum of the calibration input voltage and the virtual ground voltage.

7. The structure of claim 1, wherein each programmable resistor is programmable to any one of multiple different resistance states to store a weight value as a function of a programmed resistance state.

8. The structure of claim 1, wherein each programmable resistor comprises any of a resistive random access memory-type resistor, a phase change memory-type resistor, and a magnetic tunnel junction-type resistor.

9. A structure comprising:
an array of memory banks arranged in rows and columns, wherein each memory bank comprises:
operational circuitry;
calibration circuitry; and
duplicate pairs of single resistor memory elements, wherein each duplicate pair of single resistor memory elements comprises:
two single resistor memory elements, each single resistor memory element comprising a programmable resistor; and
switches at opposing end terminals of the programmable resistor of each single resistor memory element, and
wherein the switches are controllable so that each programmable resistor of each single resistor memory element of each duplicate pair is connectable to the operational circuitry, connectable the calibration circuitry, and disconnectable from both the operational circuitry and the calibration circuitry.

10. The structure of claim 9, wherein the duplicate pairs of the single resistor memory elements and the switches facilitate concurrent performance of both in-memory pipeline processing and calibration processing.

11. The structure of claim 9,
wherein the calibration circuitry in each memory bank comprises:
a calibration supply line;
a calibration output node;
a calibration sense line comprising a calibration bias node, wherein the opposing end terminals of each programmable resistor of each single resistor memory element of each of the duplicate pairs of the single resistor memory elements in the memory bank are connectable to the calibration supply line and the calibration sense line; and
a calibration feedback buffer circuit connected to the calibration bias node and the calibration output node, and
wherein the structure further comprises additional calibration circuitry comprising:
calibration interconnect lines for the columns, respectively, each calibration interconnect line for each column being connected to all calibration output nodes of all memory banks in the column; and
calibration sensing elements for the columns and connected to the calibration interconnect lines, respectively.

12. The structure of claim 11,
wherein, during calibration processing of a specific programmable resistor of a specific single resistor memory element of a specific duplicate pair in a specific memory bank of a specific column, the opposing end terminals of the specific programmable resistor are connected to the calibration supply line and the calibration sense line for the specific memory bank,
wherein the calibration supply line supplies a level shifted calibration input voltage to the specific programmable resistor, and
wherein the level shifted calibration input voltage is equal to a sum of a calibration input voltage plus a virtual ground voltage.

13. The structure of claim 12, wherein the calibration feedback buffer circuit for the specific memory bank biases the calibration bias node to the virtual ground voltage.

14. The structure of claim 11, wherein the additional calibration circuitry further comprises calibration analog-to-digital converters for the columns and connected to the calibration sensing elements, respectively.

15. The structure of claim 9, wherein each programmable resistor is programmable to any one of multiple different resistance states to store a weight value as a function of a programmed resistance state.

16. A structure comprising:
an array of memory banks arranged in rows and columns, wherein each memory bank comprises:
operational circuitry;
calibration circuitry; and
duplicate pairs of dual resistor memory elements, wherein each duplicate pair of dual resistor memory elements comprises:
two dual resistor memory elements, each dual resistor memory element comprising a first programmable resistor and a second programmable resistor; and
switches at opposing end terminals of both programmable resistors of each dual resistor memory element, and wherein the switches are controllable so that each programmable resistor of each dual resistor memory element of each duplicate pair is connectable to the operational circuitry, connectable the calibration circuitry, and disconnectable from both the operational circuitry and the calibration circuitry.

17. The structure of claim 16, wherein the duplicate pairs of the dual resistor memory elements and the switches facilitate concurrent performance of both in-memory pipeline processing and calibration processing.

18. The structure of claim 16,
wherein the calibration circuitry in each memory bank comprises:
a calibration supply line;
a calibration output node;
a calibration sense line comprising a calibration bias node, wherein the opposing end terminals of each programmable resistor of each dual resistor memory element of each of the duplicate pairs of the dual resistor memory elements in the memory bank are connectable to the calibration supply line and the calibration sense line; and
a calibration feedback buffer circuit connected to the calibration bias node and the calibration output node, and
wherein the structure further comprises additional calibration circuitry comprising:
calibration interconnect lines for the columns, respectively, each calibration interconnect line for each column being connected to all calibration output nodes of all memory banks in the column; and
calibration current-to-voltage converters for the columns and connected to the calibration interconnect lines, respectively.

19. The structure of claim 18,
wherein, during calibration processing of a specific programmable resistor of a specific dual resistor memory element of a specific duplicate pair in a specific memory bank of a specific column, the opposing end terminals of the specific programmable resistor are connected to the calibration supply line and the calibration sense line for the specific memory bank,
wherein the calibration supply line supplies a level shifted calibration input voltage to the specific programmable resistor,
wherein the level shifted calibration input voltage is equal to a sum of a calibration input voltage plus a virtual ground voltage, and
wherein the calibration feedback buffer circuit for the specific memory bank biases the calibration bias node to the virtual ground voltage.

20. The structure of claim 18, wherein the additional calibration circuitry further comprises calibration analog-to-digital converters for the columns and connected to the calibration current-to-voltage converters, respectively.

* * * * *